(12) United States Patent
Nguyen et al.

(10) Patent No.: US 12,538,437 B2
(45) Date of Patent: *Jan. 27, 2026

(54) ELECTRONIC DEVICES INCLUDING COLORED GLASS-BASED COMPONENTS

(71) Applicant: Apple Inc., Cupertino, CA (US)

(72) Inventors: Que Anh S. Nguyen, San Jose, CA (US); James R. Wilson, Cupertino, CA (US); Matthew S. Rogers, San Jose, CA (US); Weidi Zhu, Milpitas, CA (US); Nisha S. Sheth, San Mateo, CA (US)

(73) Assignee: APPLE INC., Cupertino, CA (US)

( * ) Notice: Subject to any disclaimer, the term of this patent is extended or adjusted under 35 U.S.C. 154(b) by 764 days.

This patent is subject to a terminal disclaimer.

(21) Appl. No.: 17/891,648

(22) Filed: Aug. 19, 2022

(65) Prior Publication Data

US 2023/0056403 A1 Feb. 23, 2023

Related U.S. Application Data

(60) Provisional application No. 63/235,956, filed on Aug. 23, 2021.

(51) Int. Cl.
*H05K 5/00* (2025.01)
*H04B 10/40* (2013.01)

(52) U.S. Cl.
CPC .......... *H05K 5/0018* (2022.08); *H04B 10/40* (2013.01)

(58) Field of Classification Search
CPC ......... H05K 2201/0108; H05K 3/1258; H05K 1/0296; H05K 3/107; H05K 9/0096; H05K 2203/0108; H05K 1/189; H05K 3/10; H05K 2201/0376; H05K 2201/09681; H05K 2201/0329; H05K 2201/09036

(Continued)

(56) References Cited

U.S. PATENT DOCUMENTS

| 11,497,121 B2 | 11/2022 | Lee et al. |
| 2014/0154440 A1 | 6/2014 | Iida et al. |

(Continued)

FOREIGN PATENT DOCUMENTS

| CN | 101533199 | 9/2009 |
| CN | 101798179 | 8/2010 |

(Continued)

OTHER PUBLICATIONS

U.S. Appl. No. 18/239,582, filed Aug. 29, 2023, pending.

(Continued)

*Primary Examiner* — Ajibola A Akinyemi
(74) *Attorney, Agent, or Firm* — Brownstein Hyatt Farber Schreck, LLP

(57) ABSTRACT

Components formed from colored glass-based materials are disclosed. A cover member formed from a colored glass-based material may be positioned over one or more device components such as a component of a wireless communication or charging system. The cover member may have optical properties, electrical properties, magnetic properties, and/or mechanical properties compatible with the requirements of the one or more device components. In some cases, different portions of the cover member may be configured to have different optical and/or electrical properties.

20 Claims, 9 Drawing Sheets

(58) Field of Classification Search
USPC .................................................... 455/575.1
See application file for complete search history.

(56) References Cited

U.S. PATENT DOCUMENTS

| | | | |
|---|---|---|---|
| 2018/0362390 | A1 | 12/2018 | Claireaux et al. |
| 2020/0022601 | A1* | 1/2020 | Rogers ................... A61B 5/031 |
| 2020/0153203 | A1* | 5/2020 | Hatzilias ................. H01S 5/183 |
| 2020/0282424 | A1* | 9/2020 | Oralkan ................ B81B 3/0083 |
| 2021/0014992 | A1 | 1/2021 | Limarga et al. |
| 2021/0168225 | A1 | 6/2021 | Bates et al. |

FOREIGN PATENT DOCUMENTS

| | | |
|---|---|---|
| CN | 108640528 | 10/2018 |
| CN | 109411646 | 3/2019 |
| CN | 111848160 | 10/2020 |
| EP | 3716589 | 9/2020 |
| WO | WO2021/236780 | 11/2021 |

OTHER PUBLICATIONS

U.S. Appl. No. 18/239,640, filed Aug. 29, 2023, pending.
U.S. Appl. No. 18/239,671, filed Aug. 29, 2023, pending.
U.S. Appl. No. 18/239,686, filed Aug. 29, 2023, pending.
Heinz et al., "Excimer Laser Induced Spatially Resolved Formation and Implantation of Plasmonic Particles in Glass," Nanomaterials 8, 1035, 10 pages, 2018.
Ono et al., "Higher Toughness of Metal-nanoparticle-implanted Sodalime Silicate Glass with Increased Ductility," Scientific Reports, 9:15387, www.nature.com/scientificreports, 11 pages, 2019.
Ono et al., "Tuning the mechanical toughness of the metal nanoparticle-implanted glass: The affect of nanoparticle growth conditions," J. Am. Ceram Soc., 104, 1 page, 2021.
Qiu et al., Manipulation of Gold Nanoparticles Inside Transparent Materials, Angew. Chem. Int. Ed, 43, 2230-2234, 2004.
Vogel, Werner, "Glass Chemistry," 2nd Edition, Springer-Verlag, 25 pages, 1985.

* cited by examiner

ELECTRONIC DEVICES INCLUDING COLORED GLASS-BASED COMPONENTS

CROSS-REFERENCE TO RELATED APPLICATION(S)

This application is a nonprovisional application of and claims the benefit of U.S. Provisional Patent Application No. 63/235,956, filed Aug. 23, 2021, and titled "Electronic Devices Including Colored Glass-Based Components," the disclosure of which is hereby incorporated herein by reference in its entirety.

FIELD

The described embodiments relate generally to components for electronic devices that include a colored glass-based material. More particularly, the present embodiments relate to colored glass and glass ceramic enclosure components.

BACKGROUND

Some modern day portable electronic devices may include a wireless communication system and/or a wireless charging system. Typically, such wireless communication and/or charging systems are positioned within the enclosure of the electronic device. Embodiments described herein are directed to electronic device enclosures that include colored glass-based enclosure components and that may have advantages as compared to some traditional electronic device enclosures.

SUMMARY

Embodiments described herein relate generally to components for electronic devices that include a colored glass-based material. A component including the colored glass-based material may be an enclosure component of the electronic device, such as a cover member. In some embodiments, the component is a colored glass component or a colored glass ceramic component.

In embodiments, the colored glass-based material may be a colored glass material or a colored glass ceramic material. In additional embodiments, the component may include both a colored glass material and a colored glass ceramic material. The color of the enclosure component may be seen when viewed normal to the front-facing surface and when viewed from the side. A coating including a color layer may also be coupled to a rear-facing surface of the enclosure component. In some cases, this coating may be configured to be neutral in color or to give the assembly of the coating and the enclosure component a color different than the color of the enclosure component, as is explained in further detail with respect to FIGS. 1B and 2.

In embodiments, the enclosure component including the colored glass-based material is configured to provide particular optical properties to the electronic device. For example, the enclosure component including the colored glass-based material may have optical properties suitable for use over one or more internal components of the electronic device. The optical properties may include one or more of a color value, a transmission value, or an absorption value. The transmission value may be measured over a visible wavelength range or an infrared (IR) wavelength range.

In some embodiments, the enclosure component includes a thinner portion and a thicker portion, and the optical properties of the thinner portion vary from those of the thicker portion. The colored glass-based material and the enclosure component may be configured so that the variation in optical properties between the thinner and thicker portions of the enclosure component is large enough to be noticeable but not large enough to produce a disharmonious effect. In some cases, the optical properties of the thinner portion and/or the thicker portion may be configured to be suitable for use over an internal component such as a sensor.

The enclosure component including a colored glass-based material may be also configured to have electrical and/or magnetic properties suitable for use over an internal component of the electronic device. For example, the colored glass-based material may be configured to have dielectric properties suitable for use over a component of a wireless communication system. In addition, the colored glass-based material may be configured to have magnetic properties suitable for use over a component of a wireless charging system. For example, the colored glass-based material may be substantially non-magnetic.

In addition, the enclosure component including the colored glass-based material may be configured to have mechanical properties which provide resistance to both breakage and scratches. For example, the colored glass-based material may be chemically strengthened to produce a compressive stress layer along one or more surfaces of the enclosure component. In an additional example, the internal structure of a colored glass ceramic material may be configured to provide additional toughness and impact resistance to the enclosure component.

In addition, the disclosure provides an electronic device comprising a display and an enclosure. The enclosure comprises an enclosure component, a front cover assembly coupled to the enclosure component and comprising a front cover member positioned over the display, and a rear cover assembly coupled to the enclosure component and including a rear cover member formed from a glass material including metal nanoparticles configured to impart color to the glass and a coating disposed along an interior surface of the rear cover member. The rear cover member comprises a first portion defining a first thickness and characterized by a first color and a second portion defining a second thickness, greater than the first thickness, and characterized by a second color, different from the first color.

The disclosure provides an electronic device comprising an enclosure. The enclosure comprises an enclosure component defining a side surface of the electronic device, a front cover assembly coupled to the enclosure component, defining a front surface of the electronic device, and comprising a front cover member and a rear cover assembly coupled to the enclosure component, defining a rear surface of the electronic device, and comprising a rear cover member. The rear cover member is formed from a colored glass material having a dielectric constant from 5 to 6.5 in a frequency band from 5 GHz to 40 GHZ and an optical coating disposed along an interior surface of the rear cover member. At least a portion of the rear cover member has an average transmission for visible light greater than 75% and a chroma value of at least 1.75. The electronic device further comprises a display positioned below the front cover assembly and transceiver component of a wireless communication system positioned below the rear cover assembly.

The disclosure also provides an electronic device comprising a display, a rear-facing camera array comprising an array of camera modules, and an enclosure. The enclosure comprises an enclosure component defining a side surface of the electronic device, a first cover assembly defining a front surface of the electronic device, the cover assembly comprising a first cover member positioned over the display, and a second cover assembly defining a rear surface of the electronic device and comprising a second cover member formed of a colored glass, a first portion of the second cover member having a first L* value and a second portion of the second cover member having a second L* value, less than the first L* value and defining an array of through-holes, each camera module of the array of camera modules extending into a respective through-hole of the array of through-holes. The second cover assembly further comprises a coating disposed along an interior surface of the second cover member.

BRIEF DESCRIPTION OF THE DRAWINGS

The disclosure will be readily understood by the following detailed description in conjunction with the accompanying drawings, wherein like reference numerals designate like elements.

Figure 1A:
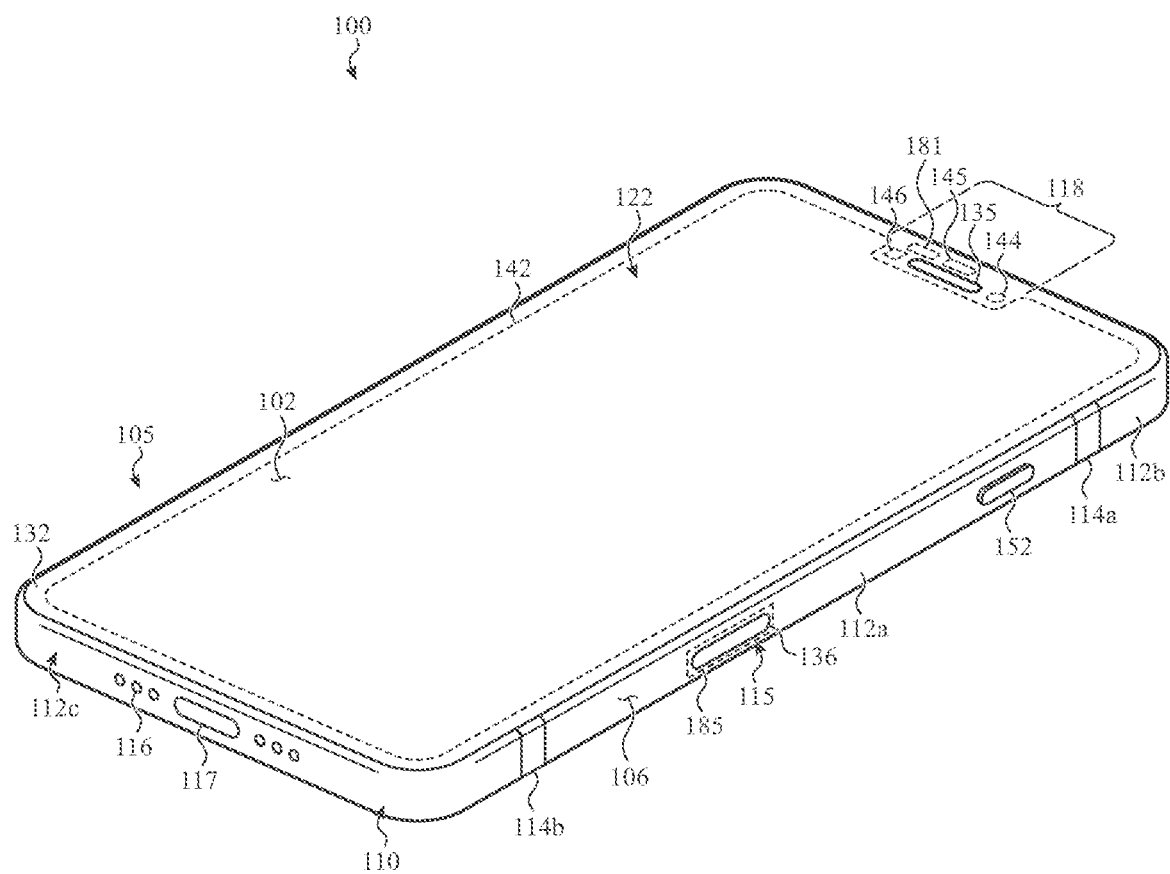
FIGS. 1A and 1B show views of an example electronic device.

The use of cross-hatching or shading in the accompanying figures is generally provided to clarify the boundaries between adjacent elements and also to facilitate legibility of the figures. Accordingly, neither the presence nor the absence of cross-hatching or shading conveys or indicates any preference or requirement for particular materials, material properties, element proportions, element dimensions, commonalities of similarly illustrated elements, or any other characteristic, attribute, or property for any element illustrated in the accompanying figures.

Additionally, it should be understood that the proportions and dimensions (either relative or absolute) of the various features and elements (and collections and groupings thereof) and the boundaries, separations, and positional relationships presented therebetween, are provided in the accompanying figures merely to facilitate an understanding of the various embodiments described herein and, accordingly, may not necessarily be presented or illustrated to scale, and are not intended to indicate any preference or requirement for an illustrated embodiment to the exclusion of embodiments described with reference thereto.

DETAILED DESCRIPTION

Reference will now be made in detail to representative embodiments illustrated in the accompanying drawings. It should be understood that the following descriptions are not intended to limit the embodiments to one preferred implementation. To the contrary, the described embodiments are intended to cover alternatives, modifications, and equivalents as can be included within the spirit and scope of the disclosure and as defined by the appended claims.

The following disclosure relates generally to components for electronic devices that include a colored glass-based material. A component including the colored glass-based material may be an enclosure component, such as a cover member. The disclosure also relates to enclosures including these components and electronic devices including these enclosures.

In some cases, a product line of electronic devices may have enclosure components formed from a set of colored glass-based material compositions. Each composition of the set may be configured to provide an enclosure component which meets one or more performance specifications while providing a particular color. For example, the enclosure component may be required to meet technical specifications for one or more electrical properties which ensure that the enclosure component allows reliable wireless transmission. Further, the enclosure component may be required to meet technical specifications for light transmission, strength, and the like as described in more detail below.

In embodiments, the enclosure component including the colored glass-based material is configured to provide particular optical properties to the electronic device. The optical properties may include one or more of a color value, a transmission value, an absorption value, or a color value. The color of the cover member may be characterized in several ways, such as by coordinates in CIEL*a*b* (CIELAB) color space, coordinates in L*C*h color space, or both. In some examples, the color of an enclosure component is characterized by an a* value having a magnitude greater than or equal to 0.5, greater than or equal to 0.75, or greater than or equal to 1. In additional examples, the color of an enclosure component is characterized by a b* value having a magnitude greater than or equal to 1, greater than or equal to 1.5, or greater than or equal to 2. In further examples, the color of an enclosure component is characterized by having a C* value greater than 1.75, greater than 2, or greater than 2.5. Additional description of color space parameters is provided with respect to FIG. 4 and that description is generally applicable herein.

Figure 4:
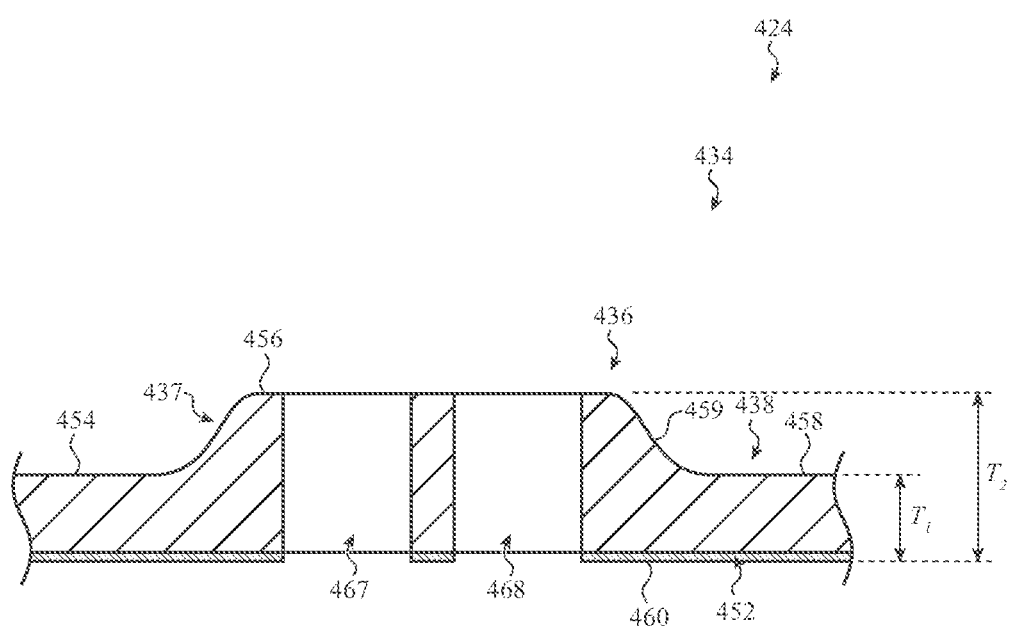
FIG. 4 shows a partial cross-sectional view of an example cover member assembly of an electronic device.

The transmission value may be measured over a visible wavelength range or an infrared (IR) wavelength range. For example, the colored glass-based enclosure component may have a transmission ranging from 75% to 95%, 80% to 90%, or 80% to 95% over a visible light range. As an additional example, a colored glass-based enclosure component may have a transmission ranging from 70% to 95% or from 80% to 95% over an IR light range. Each of these transmission values may be average transmission values. In some cases, the colored glass-based enclosure component has an IR transmission value suitable for use over an optical module configured to operate over an IR wavelength range. The additional description of transmission parameters provided with respect to FIG. 4 is generally applicable herein.

In some embodiments, the enclosure component includes a thinner portion and a thicker portion, and the optical properties of the thinner portion differ from those of the thicker portion. The colored glass-based material and the enclosure component may be configured so that the variation in optical properties between the thinner and thicker portions of the enclosure component is large enough to be noticeable but not so large that a disharmonious effect is produced. Additional description of variations in optical properties of an enclosure component having thinner and thicker portions is provided with respect to FIG. 4 and that description is generally applicable herein. The thicker portion may also be referred to herein as a thick portion and the thinner portion may also be referred to as a thin portion herein.

The enclosure material including a colored glass-based material may be also configured to have electrical and/or magnetic properties suitable for use over an internal component of the electronic device. In some cases, the colored glass-based material may be configured to have dielectric properties suitable for use over a component of a wireless communication system. For example, the colored glass-based material may have a dielectric constant from 3 to 7, 4 to 8, 4 to 6.5, 5 to 7, 5 to 6.5, or 6 to 7 in a radio frequency band such as a band from about 5 GHz to about 40 GHZ. In addition, the colored glass-based material may be configured to have magnetic properties suitable for use over a component of a wireless charging system. For example, the colored glass-based material may be substantially non-magnetic. The description provided with respect to FIG. 4 of electrical and magnetic properties of the colored glass-based material is generally applicable herein and is not repeated here.

In addition, the enclosure component including the colored glass-based material may be configured to have mechanical properties which provide resistance to both breakage and scratches. For example, the colored glass-based material may be chemically strengthened to produce a compressive stress layer along one or more surfaces of the enclosure component. In an additional example, the internal structure (e.g., the size, amount, and distribution of crystals) of a colored glass ceramic material may be configured to provide additional toughness and impact resistance to the enclosure component.

In some cases, an enclosure component or other component of the electronic device is formed from one of a set of colored glass-based material compositions. Each composition of the set of compositions may produce a different color of the enclosure component. The set of compositions may be selected so that the enclosure component also has an optical property other than color (e.g., IR transmission), an electrical property (e.g., dielectric constant), or both within a specified range. The uniformity of this optical and/or electrical property allows differently colored enclosure components to have similar performance when placed over an internal component such as a component of a wireless communication or charging system or sensor, as explained in more detail with respect to FIG. 3.

In some embodiments the colored glass-based material may be a colored glass material or a colored glass ceramic material. In additional embodiments, the component may include both a colored glass material and a colored glass ceramic material. For example, the component may be formed from a crystallizable colored glass material which is then crystallized to form the colored glass ceramic material. In some cases, the colored glass-based material derives its color from elements which are incorporated into a glass and/or a crystalline phase of the material. Alternatively or additionally, the colored glass-based material derives its color from elements which form a distinct nanophase (e.g., metal nanoparticles) within the glass and/or a crystalline phase of the material. The description provided with respect to FIG. 4 of suitable elements for imparting color to the glass-based material is generally applicable herein and is not repeated here.

The composition of the glass-based material including a "coloring" element may affect not only the color of an enclosure component but may also affect another optical property and/or an electrical or magnetic property. For example, inclusion of the coloring element(s) in a glass material may modify the dielectric constant of the glass as compared to a "base" glass material. Therefore, in some cases colored glass-based material compositions useful for the enclosure components described herein provide a balance between desired colors and desired electrical and/or magnetic properties. The description provided with respect to FIG. 4 of the balance between color and electrical and/or magnetic properties is generally applicable herein and is not repeated here. In some cases, a set of compositions of the glass-based material may be established so that different colors of enclosure components may be produced while providing acceptable levels of uniformity of an electrical, a magnetic, and/or another optical property.

The composition of the glass-based material including a "coloring" element may also affect a mechanical property as well as the optical properties and the electrical and/or magnetic properties. For example, including ductile nanophases, such as metallic nanoparticles, in the glass-based material may increase the toughness of the glass-based material. Therefore, in some cases, colored glass-based material compositions useful for the enclosure components described herein provide a balance between desired colors, other desired optical properties, desired electrical and/or magnetic properties, and desired mechanical properties. The description provided with respect to FIG. 4 of the balance between electrical properties and mechanical properties is generally applicable herein and is not repeated here.

Figure 2:
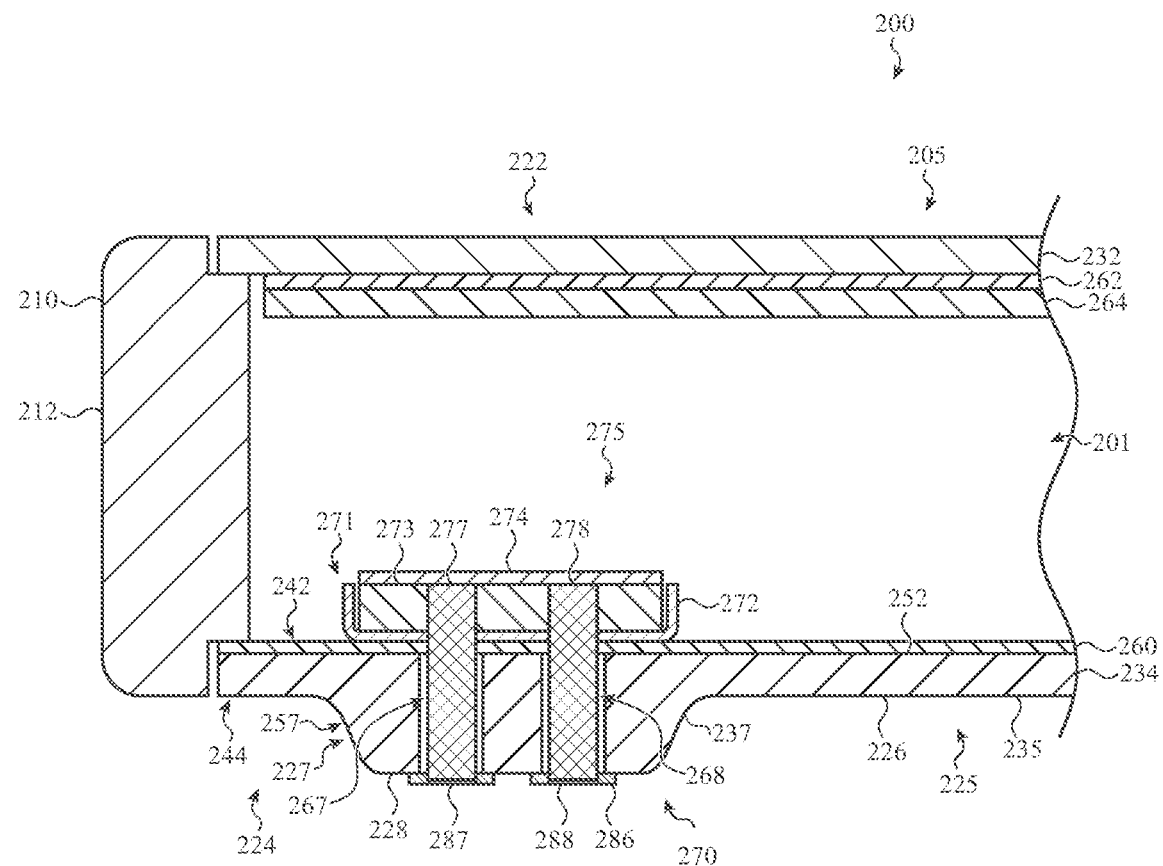
FIG. 2 shows an example cross-sectional view of an electronic device including a rear-facing sensing array.

In some embodiments, the enclosure component is part of an assembly and the optical properties of the component including the colored glass-based material influence the optical properties of the assembly. In additional embodiments, a cover assembly may include a cover member formed of the colored glass-based material and a coating coupled to a rear-facing surface of the enclosure component. The coating may affect the amount of light transmitted back through the cover member and thus may be termed an optical coating. The optical properties of both the cover member and the coating may influence the optical properties of the assembly. The coating may be configured to be neutral (or near neutral) in color or may be configured to give the assembly a different color than the enclosure component. The additional description of the effect of the coating on the perceived color of a cover assembly provided with respect to FIG. 2 is generally applicable herein.

These and other embodiments are discussed below with reference to FIGS. 1A-8. However, those skilled in the art will readily appreciate that the detailed description given herein with respect to these figures is for explanatory purposes only and should not be construed as limiting.

Figure 1B:
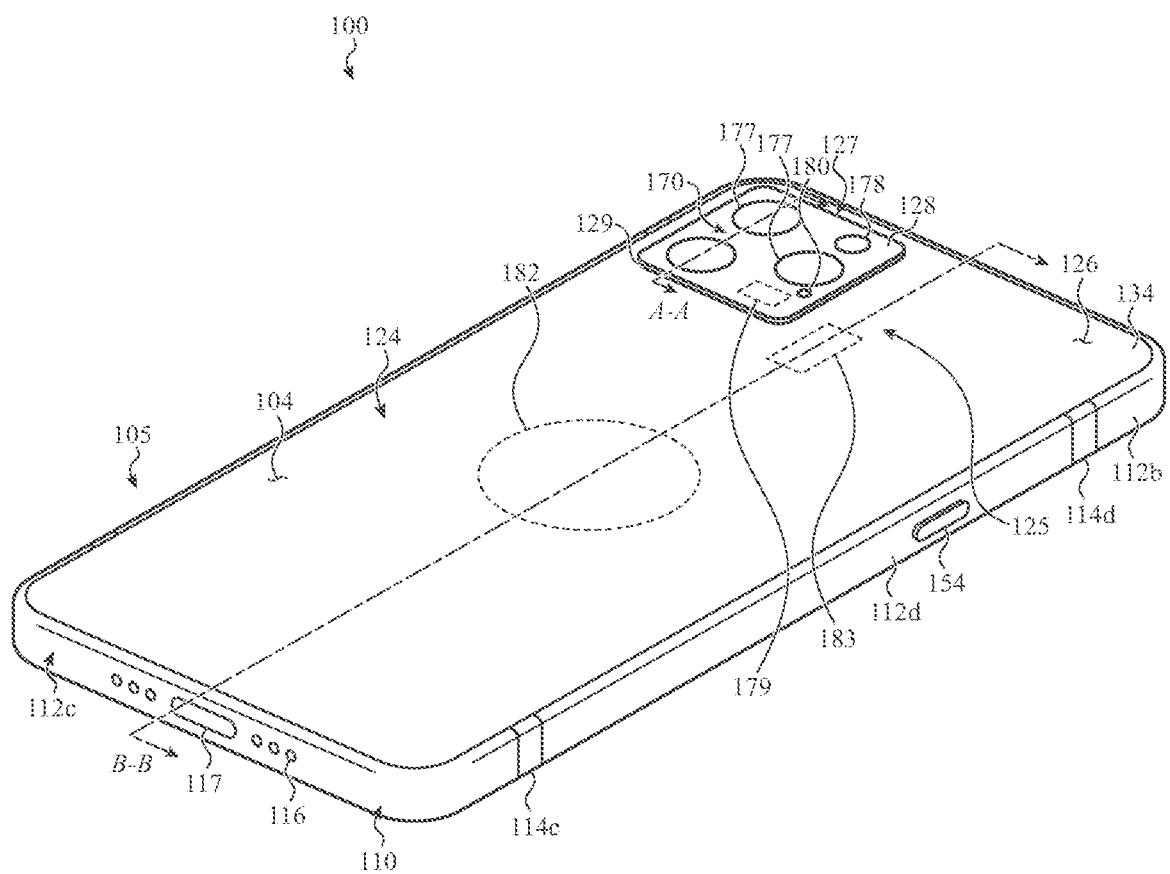

FIGS. 1A and 1B show an example of an electronic device or simply "device" 100. For purposes of this disclosure, the device 100 may be a portable electronic device including, for example a mobile phone, a tablet computer, a portable computer, a laptop, a wearable electronic device, a portable music player, a health monitoring device, a portable terminal, a wireless charging device, a device accessory, or other portable or mobile device.

As shown in FIGS. 1A and 1B, the electronic device 100 includes an enclosure 105. The enclosure 105 includes a front cover assembly 122, a rear cover assembly 124, and an enclosure component 110. Internal components of the device may be at least partially enclosed by the front and rear cover assemblies 122, 124 and the enclosure component 110 and, in some cases, may be positioned within an internal cavity defined by the enclosure (e.g., 201 of FIG. 2). The example of FIGS. 1A and 1B is not limiting and in other examples internal components of the device may be enclosed by an enclosure component in combination with a single cover or any other suitable configuration.

The enclosure 105 includes one or more components including a colored glass-based material. In some cases, these components are formed from the colored glass-based material. In embodiments, the component including the colored glass-based material is in the form of a cover member included in the rear cover assembly 124. The component including the colored glass-based material may be positioned over one or more internal components of the electronic device 100 such a radio-frequency (RF) antenna assembly (which may be a directional antenna assembly), a component for an inductive coupling wireless charging system, or the like. The component including the colored glass-based material may also define an opening over one or more internal components of the electronic device, such as an optical module of a camera assembly or a sensor assembly.

In some embodiments, the colored glass-based material is a colored glass material. In additional embodiments, the colored glass-based material is a colored glass ceramic material or a combination of the colored glass material and a colored glass ceramic material. Additional description of colored glass-based material compositions is provided with respect to FIG. 4 and, for brevity, that description is not repeated here.

The front cover assembly 122 may at least partially define a front surface 102 of the electronic device. In the example of FIG. 1A, the front cover assembly defines a substantial entirety of the front surface 102 of the electronic device. In the example of FIG. 1A, the front cover assembly 122 includes a cover member 132 (also referred to herein as a front cover member). The cover member 132 may extend laterally across the cover assembly 122, such as substantially across the width and the length of the cover assembly. The front cover assembly 122 may also include an exterior coating such as an oleophobic coating and/or an anti-reflective coating. The front cover assembly 122 may also define an opening, such as the opening 135, which may be positioned over a speaker or another internal device. Alternately or additionally the front cover assembly 122 may include an interior coating such as a masking layer which provides an opaque portion of the front cover assembly 122. These exterior and/or interior coatings may be disposed on the cover member 132. In addition, the front cover assembly may include a mounting frame which is coupled to an interior surface of the cover member 132 and to the enclosure component 110.

In embodiments, the front cover assembly 122 is substantially transparent or includes one or more substantially transparent portions over the display 142 and/or an optical component configured to operate over a visible wavelength range (e.g., an optical component of the camera assembly 144). As referred to herein, a component or material is substantially transparent when light is transmitted through the material and the extent of scattering is low. The front cover assembly 122 may also be configured to have electrical properties and/or magnetic properties compatible with one or more internal components of the electronic device.

Typically, the cover member 132 is substantially transparent or includes one or more substantially transparent portions over a display and/or an optical component configured to operate over a visible wavelength range. The cover member 132 may also include one or more translucent and/or opaque portions in combination with the one or more substantially transparent portions. For example, the transmission of the cover member 132 (or the transparent portions thereof) may be at least 85%, 90%, or 95% over a visible wavelength range (e.g., the visible spectrum), and the haze may be less than about 5% or 1%. This transmission value may be an average value.

In addition, the cover member 132 or portions of the cover member 132 positioned over a display or optical module may be configured to have a sufficiently neutral color that the optical input to the optical module and/or the optical output provided by the display 142 is not significantly degraded. For example, these portions of the front cover member may be described by an L* value of 90 or more, an a* value having a magnitude less than 0.5, and a b* value having a magnitude less than 1. In some embodiments, a colored glass as described herein may define other portions of the cover member 132, such as peripheral portions of a cover member.

The cover member 132 may also be configured to have additional optical properties, electrical properties, and/or magnetic properties compatible with one or more internal components of the electronic device. For example, the cover member 132 may be configured to provide infrared (IR) transmission suitable for use over an optical component configured to produce images from infrared light (e.g., near-IR light). In some cases, the cover member 132 may have a transmission value of at least 85%, 90%, or 95% over an infrared wavelength range (e.g., from 770 nm to 1000 nm). These transmission values may be average values over the infrared wavelength range. As an additional example, cover member 132 may be configured to provide electrical properties suitable for use over a component of a wireless communication system, such as the component 181. For example, the cover member 132 may be a dielectric cover member and may be formed from a material having a dielectric constant and a dissipation factor sufficiently low to allow transmission of RF or IR (e.g., near-IR) signals through the cover member.

In some cases, the cover member 132 may be formed from a glass material, a glass ceramic material, or a combination thereof. In additional cases, the cover member 132 may be formed from one or more layers such as a glass layer, a glass ceramic layer, a ceramic layer, or a polymer layer. In some embodiments, the cover member 132 has a thickness less than 3 mm, less than or equal to 2 mm, less than or equal to 1 mm, from about 250 microns to about 1 mm, or from about 500 microns to about 1 mm.

The rear cover assembly 124 may at least partially define a rear surface 104 of the electronic device. In the example of FIG. 1B, the rear cover assembly 124 defines a substantial entirety of the rear surface 104 of the electronic device. The rear cover assembly 124 includes a cover member 134. In some cases, the rear cover assembly 124 also includes at least one (optically) transparent window member. The rear cover assembly 124 may also include one or more coatings. For example, the rear cover assembly 124 may include an exterior coating such as a smudge-resistant (e.g., oleophobic) coating. Alternately or additionally, the rear cover assembly 124 may include one or more interior coatings which provide a decorative effect, such as a color layer, a multilayer interference stack, or a metal layer. Additional description of interior coatings is provided with respect to FIG. 2. These exterior and/or interior coatings may be disposed on the cover member 134. In addition, the rear cover assembly 124 may include a mounting frame which is coupled to an interior surface of the cover member 134 and to the enclosure component 110. In the example of FIG. 1B, the rear cover assembly 124 is positioned over the device component 182, which may be a wireless charging component, and the device component 183, which may be a wireless communication component.

In some cases, the rear cover assembly 124 may be characterized by a color, such as a color other than a neutral color. The color of the rear color assembly may be characterized by coordinates in CIEL*a*b* (CIELAB) color space. Alternately or additionally, the color of the rear cover assembly may be characterized by coordinates in L*C*h color space. In embodiments, a perceived color of the rear cover assembly 124 is due at least in part to a color of a corresponding portion of the rear cover member 134. In further embodiments, the perceived color of the rear cover assembly 124 is due to both the color of the corresponding portion of the rear cover member 134 and the optical properties of an interior coating.

The rear cover assembly 124 may also include one or more substantially transparent portions (e.g., over an optical component 177 configured to operate over a visible wavelength range). The rear cover assembly 124 may also include one or more translucent and/or opaque portions in combination with the one or more substantially transparent portions. For example, the rear cover assembly 124 may include a translucent and/or opaque portion over a device component which is configured to operate over a range other than a visible wavelength or frequency range (e.g., an infrared (IR) wavelength range or a radio-frequency (RF) range). Similarly, the rear cover assembly 124 may include a translucent or opaque portion over a device component 182 of an inductive coupling wireless charging system.

Figure 6:
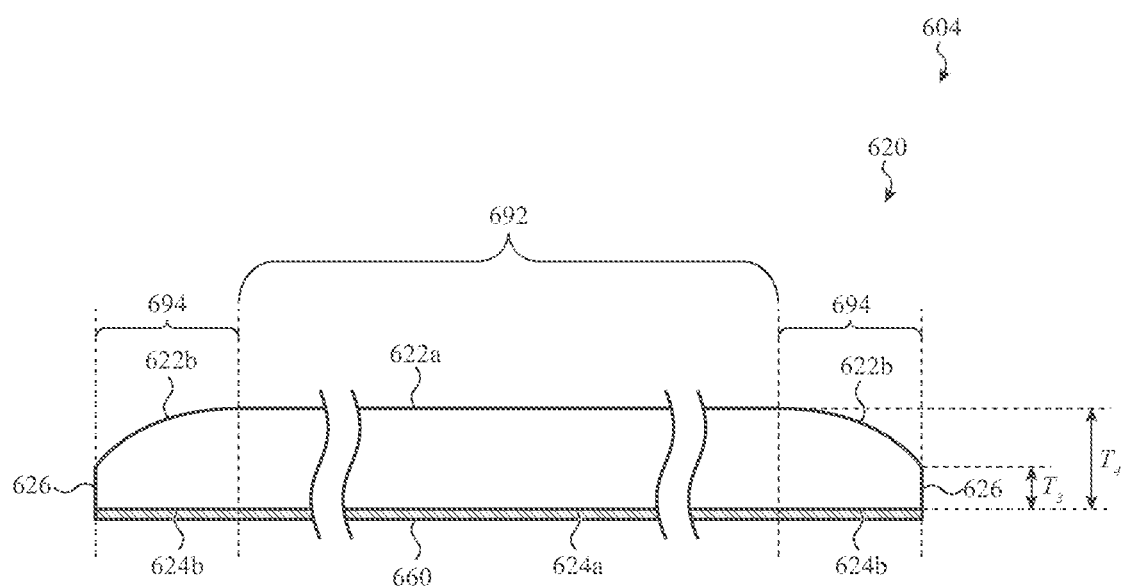
FIG. 6 shows a cross-sectional view of another example cover member assembly of an electronic device.
Figure 7:
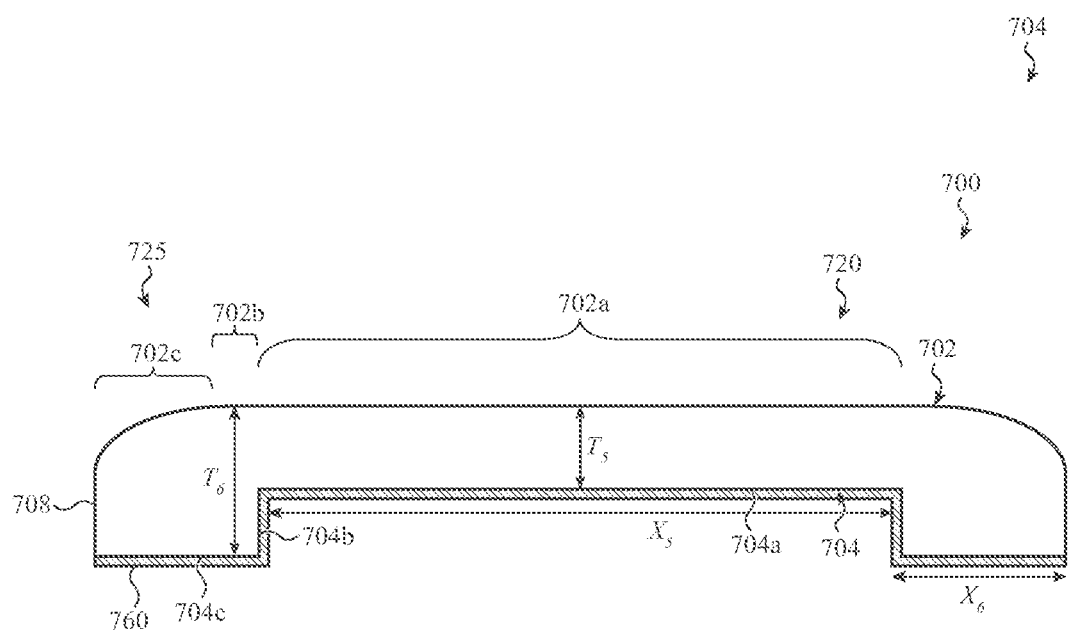
FIG. 7 shows a cross-sectional view of another example cover member assembly of an electronic device.

In embodiments described herein, different portions of the rear cover assembly 124 have different optical properties, such as different light transmission and/or color values. The difference in light transmission and/or color values of the rear cover assembly may be due to a difference in light transmission and/or color values of different portions of the cover member 134. For example, portions of the cover member 134 having different thickness, curvature, and the like may produce differences in the perceived color of the rear cover assembly 124. Changes in viewing angle may also produce differences in the perceived color of the rear cover assembly 124. Examples of cover members having thinner and thicker portions are shown in FIGS. 2, 4, and 6 to 7, while examples of cover members having changes in curvature are shown in FIGS. 4, 6, and 7.

In the example of FIG. 1B, the rear cover assembly 124 defines a thinner portion 125 and a thicker portion 127. As shown in FIG. 1B, the thicker portion 127 of the cover assembly 124 protrudes or is offset with respect to a thinner portion 125 of the cover assembly 124. The thicker portion 127 may define a raised surface 128 (also referred to as a top surface or plateau) and a side surface 129 while the thinner portion 125 may define a surface 126. In embodiments, the cover member 134 also defines a thinner portion located at the position of thinner portion 125 and a thicker portion located at the position of the thicker portion 127. Examples of cover members having thinner and thicker portions are shown in FIGS. 2 and 4 and the description provided with respect to these figures of dimensions and optical, electric, and/or magnetic properties of the cover members is generally applicable herein.

As previously discussed, the rear cover assembly 124 includes a cover member 134 (also referred to herein as a rear cover member). In embodiments, the cover member 134 is formed from the colored glass-based material. The description of the composition and optical properties of the cover member 434 is applicable to the optical properties of the cover member 134 and, for brevity, is not repeated here.

In some cases, the cover member 134 may define a corresponding thicker portion and thinner portion, with the thicker portion being integrally formed with the thinner portion. The description of the dimensions of the cover member 434 is applicable to the cover member 134 and is not repeated here. In additional cases, the thinner portion 125 may be provided by the cover member 134 while the thicker portion 127 may be provided at least in part by an additional cover member which is coupled to the thinner portion.

The thicker portion 127 may accommodate one or more components of a sensing array 170. For example, the sensing array 170 may include multiple camera assemblies. Each of the camera assemblies may include an optical component such as the optical component 177 or the optical component 178. The optical component 177 may be positioned at least partially within an opening in the thicker portion 127, as shown for optical component 277 in FIG. 2. The optical component 177 may be a camera module while the optical component 178 may be an illumination module.

In addition, the sensing array 170 may include one or more sensor assemblies, such as the sensor assembly 179. In some embodiments, the sensor assembly 179 may include one or more optical modules. For example, the sensor assembly may include an emitter module, a receiver module, or both. In some cases, the sensor assembly 179 may measure a distance to a target, such as a Lidar sensor assembly which is configured to illuminate an object with light and then detect the reflected light to determine or estimate the distance between the electronic device and the object (e.g., a time of flight (TOF) sensor). In some examples the sensor assembly 179 may be positioned below the cover member 134 (and the cover member 134 may act as a window for the sensor assembly 179). In these examples, the optical properties of the cover member 134 may be suitable for use over one or more optical components of the sensor assembly. For example, the one or more optical components may operate over one or more specified wavelength ranges and the cover member 134 may be configured to have a suitable transmission/transmittance over these wavelength ranges. In other examples, the cover member 134 may define an opening over the sensor assembly and an additional cover member may be placed in or over the opening (and act as a window for the sensor assembly).

The thicker portion 127 may also include a sensor assembly 180 which is other than an optical component. For example, the sensor assembly 180 may be a microphone which may be positioned at least partially within or below an opening in the thicker portion 127. In implementations in which the thicker portion 127 is used to protect one or more sensor modules or components, the thicker portion 127 and/or the protruding region of the thicker portion 127 may be referred to as a sensor feature, a camera feature, a sensing array, a camera panel, and/or a camera bump.

Each of the front cover assembly 122 and the rear cover assembly 124 is coupled to the enclosure component 110. The enclosure component 110 may at least partially define a side surface 106 of the electronic device 100 and may also be referred to herein as a housing. An enclosure component used in combination with front and rear cover assemblies as shown in FIGS. 1A and 1B may also be referred to as a band. The enclosure component 110 may include one or more members. In the example of FIGS. 1A and 1B, the enclosure component includes multiple members formed from a metal material (e.g., one or more metal segments). In particular, the enclosure component 110 is formed from a series of metal segments (112a, 112b, 112c, and 112d) that are separated by dielectric segments (114a, 114b, 114c, and 114d) that provide some extent of electrical isolation between adjacent metal segments (e.g., by preventing electrical conduction through the dielectric segments). For example, a polymer segment (114b) may be provided between a pair of adjacent metal segments (112a, 112c). One or more of the metal segments may be coupled to internal circuitry of the electronic device 100 and may function as an antenna for sending and receiving wireless communication. In alternate embodiments, the enclosure component 110 may include one or more members formed from a glass material, one or more members formed from a ceramic material, one or more members formed from a glass ceramic material, combinations of these, or combinations of these with one or more members formed from a metal material. The example of FIGS. 1A and 1B is not limited, and in other examples the enclosure component 110 may have a different number of members or may be of unitary construction (e.g., a unibody). In additional examples, the front and rear cover assemblies may at least partially define a side surface of the electronic device. As referred to herein, an enclosure component or member formed from a particular material, such as a metal material, may also include a relatively thin coating of a different material along one or more surfaces, such as an anodization layer, a physical vapor deposited coating, a paint coating, a primer coating (which may include a coupling agent), or the like.

The enclosure component 110 may define one or more openings or ports. In the example of FIGS. 1A and 1B, the metal segment 112c of the enclosure component 110 defines the openings 116 and 117. The opening 116 may allow (audio) input or output from a device component such as a microphone or speaker. The opening 117 may contain an electrical port or connection. In addition, the electronic device 100 may include one or more input devices. In the example of FIGS. 1A and 1B, the input devices 152 and 154 have the form of a button and may extend through additional openings in the enclosure component 110. In some cases, the electronic device 100 also includes a support plate and/or other internal structural components that are used to support internal electronic circuitry or electronic components.

In some cases, the enclosure component 110 may include one or more members 115 positioned within a metal member (e.g., 112a). In some cases, the member 115 may provide a window for the device component 185, may define a portion of a waveguide, and/or allow for beam-forming or beam-directing functionality. For example, the member 115 may define an antenna window for transmitting and receiving wireless signals. The member 115 may be configured to transmit wireless signals at one or more of the frequencies previously discussed with respect to the device components 181, 183, and 185. For example, the member 115 may be configured to transmit wireless signals at a frequency band between about 25 GHz and about 39 GHz.

The member 115 may include a cover member 136. The cover member 136 may be formed from a dielectric material. In some cases, the cover member 136 may be formed from a glass ceramic material, may include one or more glass ceramic portions, or may be formed from a glass ceramic layer in combination with one or more of a glass layer, a ceramic layer, or a polymer layer. In additional cases, the cover member 136 may be formed from a glass material, a ceramic material, a polymeric material, or combinations thereof. The cover member 136 may be substantially transparent, translucent, opaque, or include transparent, translucent, and/or opaque portions. Further, the member 115 may also include one or more coatings along the interior and/or exterior of the cover member 136. These coatings may be similar to those described for the cover members 132 and 134.

In additional embodiments, an electronic device may include a unitary cover member formed from a single piece of material (rather than the separate cover members 122 and 124 coupled to the enclosure component 110). Such a unitary cover member may also be referred to as a monolithic cover member and may include a colored glass-based material.

The electronic device 100 includes a display 142. The front cover assembly 122 is positioned over the display 142. As previously discussed, the front cover assembly 122 may be substantially transparent or include one or more substantially transparent portions over the display and/or an optical component configured to operate over a visible wavelength range. The enclosure 105 may at least partially surround the display 142 and may enclose the display 142. The display 142 may produce graphical output which is transmitted through a substantially transparent portion of the front cover assembly. In some cases, the display 142 is a touch sensitive display. The display 142 may be a liquid-crystal display (LCD), a light-emitting diode (LED) display, an LED-backlit LCD display, an organic light-emitting diode (OLED) display, an active layer organic light-emitting diode (AMOLED) display, and the like. In some embodiments, the display 142 may be attached to (or may abut) the front cover assembly 122.

The electronic device 100 further includes multiple sensing arrays. As referred to herein, a sensing array may include one or more camera assemblies (e.g., a camera array), one or more sensor assemblies (e.g., a sensor array), an illumination assembly, or combinations of these. The front sensing array 118 includes a front-facing camera assembly 144 and a front-facing sensor assembly 146. The front sensing array may also include another sensor assembly 145, which in some cases may be an ambient light sensor. The rear sensing array 170 includes an array of rear-facing camera assemblies and at least one sensor assembly as described in more detail below. An illumination assembly typically includes a light source such as a flood light source or other emitter which enables various sensing modes like face recognition and digital photography. For example, one or more emitters may emit an array of beams that are reflected off various parts of the face. The reflected beams can be used to create a point or depth map of the face and used to authenticate a user.

The sensing array may include one or more optical modules. An optical module may include a photodetector and/or image sensor, associated electronics, one or more optical lenses, optical covers, barrels, or shrouds and associated optical elements. For example, the optical module may be a camera module, an illumination module, or a sensor module. The sensing array may define any number of optical modules such as one, two, three, four, five, or six optical modules.

As shown in FIGS. 1A and 1B, the electronic device 100 includes multiple camera assemblies. For example, the electronic device 100 may include a front-facing camera assembly 144 and a rear-facing camera array. Each camera assembly may include a camera module (e.g., the optical module 177 shown in FIG. 1B). An array of camera assemblies (also referred to herein as a camera array) typically includes multiple camera modules and one or more illumination modules. When the camera array includes multiple camera modules, each of the camera modules may have a different field of view or other optical property. For example, a camera module may be configured to produce an image from visible light or infrared light. The multiple camera modules may be also referred to as a set of camera modules and in some cases may form an array of camera modules. In some cases, a camera module includes an optical sensor array and/or an optical component such as a lens, filter, or window. In additional cases, a camera module includes an optical sensor array, an optical component, and a camera module housing surrounding the optical sensor array and the optical components. The camera module may also include a focusing assembly. For example, a focusing assembly may include an actuator for moving a lens of the camera module. In some cases, the optical sensor array may be a complementary metal-oxide semiconductor (CMOS) array or the like.

The electronic device 100 further includes one or more sensor assemblies. As shown in FIG. 1A, the electronic device 100 includes one or more front-facing sensor assemblies 146. The device 100 also includes one or more rear-facing sensor assemblies as described in more detail with respect to FIG. 1B. A sensor assembly may also be referred to herein simply as a sensor. Examples of sensor (assemblies) include, but are not limited to, a proximity sensor, a light sensor (e.g., an ambient light sensor), a biometric sensor (e.g., a face or fingerprint recognition sensor or a health monitoring sensor), a depth sensor, or an imaging sensor. Other examples of sensors include a microphone or a similar type of audio sensing device, a radio-frequency identification chip, a touch sensor, a force sensor, an accelerometer, a gyroscope, a magnetometer such as a Hall-effect sensor or other magnetic sensor, or similar types of position/orientation sensing devices. When the sensor is an optical sensor, the sensor may operate over a particular wavelength range such as a visible, an infrared, or an ultraviolet wavelength range. In some cases, the optical sensor is a reflectance sensor. The electronic device may further include a processing unit (also, processor) that computes a value based on a signal from the sensor.

Figure 8:
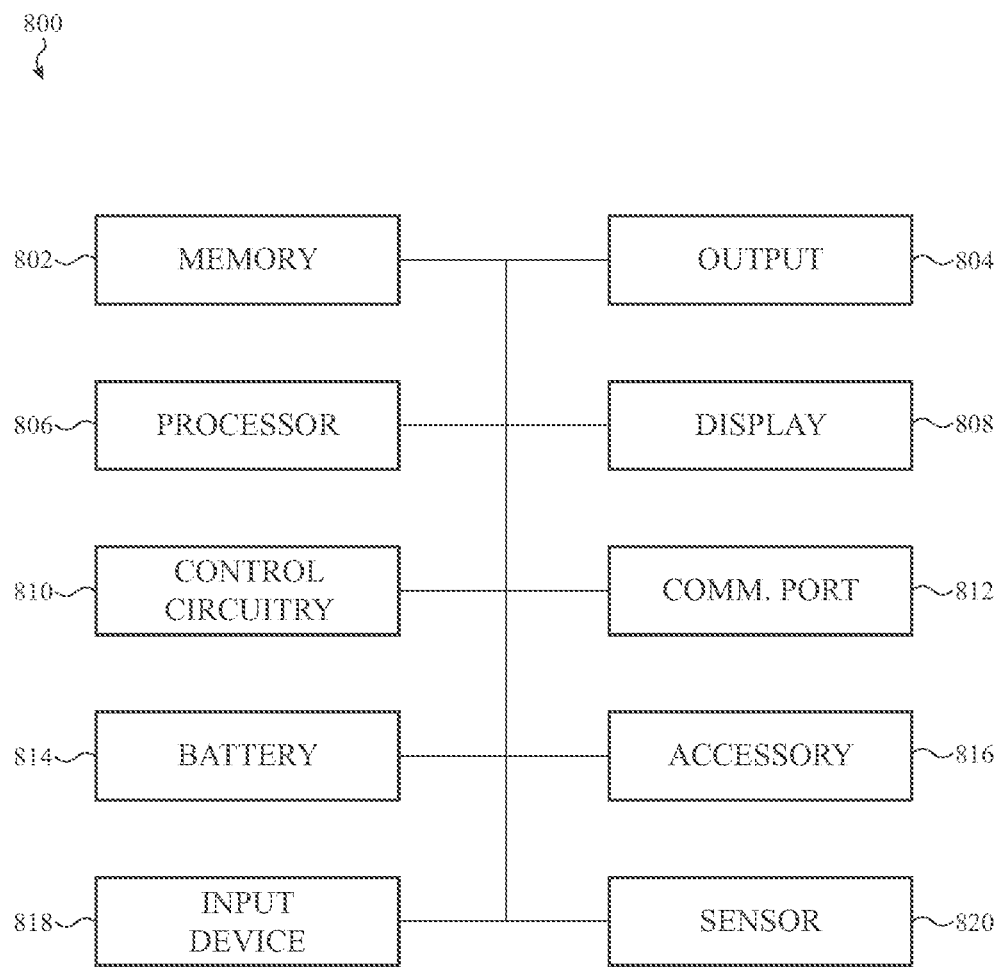
FIG. 8 shows a block diagram of a sample electronic device incorporating a colored glass-based component.

In some cases, one or more sensors may be grouped with one or more camera assemblies. As examples, the one or more sensors may be a depth measuring sensor (e.g., a time of flight sensor), an ambient light sensor, a facial recognition sensor, an infrared sensor, an ultraviolet light sensor, a health monitoring sensor, a biometric sensor (e.g., a fingerprint sensor) or the like. These sensors may be provided proximate to one or more optical modules of a camera array, as shown in FIG. 1B. The additional description of sensor assemblies, camera assemblies, and processors provided with respect to FIG. 8 is generally applicable herein.

In addition, the electronic device 100 may include one or more device components that may be part of a wireless communication system, such as the device components 181, 183, and 185. As examples, the wireless communication system may be an RF or an IR communication system. In some cases, the device components 181, 183, and 185 are wireless transmission modules that may include one or more antenna assemblies, also referred to herein simply as antennas. An RF communication system may operate at one or more of a "low band" (e.g., less than 1 GHZ, such as about 400 MHz to less than 1 GHZ, about 600 MHz to about 900 MHZ, or 600 MHz to 700 MHZ), a "mid-band" frequency range (e.g., about 1 GHz to about 6 GHZ, such as about 1 GHz to about 2.6 GHZ, about 2 GHz to about 2.6 GHZ, about 2.5 GHZ to about 3.5 GHz, or about 3.5 GHz to about 6 GHz), or a "high-band" frequency range (e.g., about 24 GHZ to about 40 GHZ, about 57 GHZ to about 64 GHZ, or about 64 GHz to about 71 GHZ), or a frequency range from about 1 GHz to about 10 GHZ. As previously discussed, a component of an RF communication system may include an RF antenna configured to radiate a radio-frequency (RF) signal. The RF antenna may be configured to operate at one or more desired RF frequency ranges or RF frequency bands.

In some cases, the electronic device 100 may include one or more groups of antennas that include elements that are configured to communicate via a 5G wireless protocol (including millimeter wave and/or 6 GHz communication signals). 5G communications may be achieved using various different communications protocols. For example, 5G communications may use a communications protocol that uses a frequency band below 6 GHZ (also referred to as the sub-6 GHz spectrum). As another example, 5G communications may use a communications protocol that uses a frequency band above 24 GHZ (also referred to as the millimeter-wave spectrum). Further the particular frequency band of any given 5G implementation may differ from others. For example, different wireless communications providers may use different frequency bands in the millimeter-wave spectrum (e.g., one provider may implement a 5G communications network using frequencies around 28 GHz, while another may use frequencies around 39 GHz). The antenna group(s) may be configured to allow communications via one or multiple of the frequency bands that implement 5G communications.

In some cases, the electronic device 100 includes one or more directional antennas (or high gain antennas). Accordingly, the antenna gains of the directional antennas may be highest along particular directions. A directional antenna may include an array of transceiver elements that are used to form the shapes and orientations of the radiation patterns (or lobes) of the antenna, which may be a millimeter wave antenna. The electronic device 100 may include multiple directional antennas which have different primary transmission directions, as explained further with respect to FIG. 3.

FIG. 2 shows an example cross-sectional view of an electronic device including a rear facing sensing array. The electronic device 200 includes an enclosure 205 which comprises a front cover assembly 222 and a rear cover assembly 224. The rear cover assembly 224 may include or be formed of a colored glass-based material. The front cover assembly 222 may include a cover member 232, a display 264, and a touch sensor 262. The electronic device also includes an enclosure component 210 which defines a side surface of the electronic device. The enclosure component may include a member 212. FIG. 2 may be an example cross-sectional view along A-A of FIG. 1B and the front cover assembly 222 and the rear cover assembly 224 and their respective elements may be as previously described with respect to FIGS. 1A and 1B.

Figure 3:
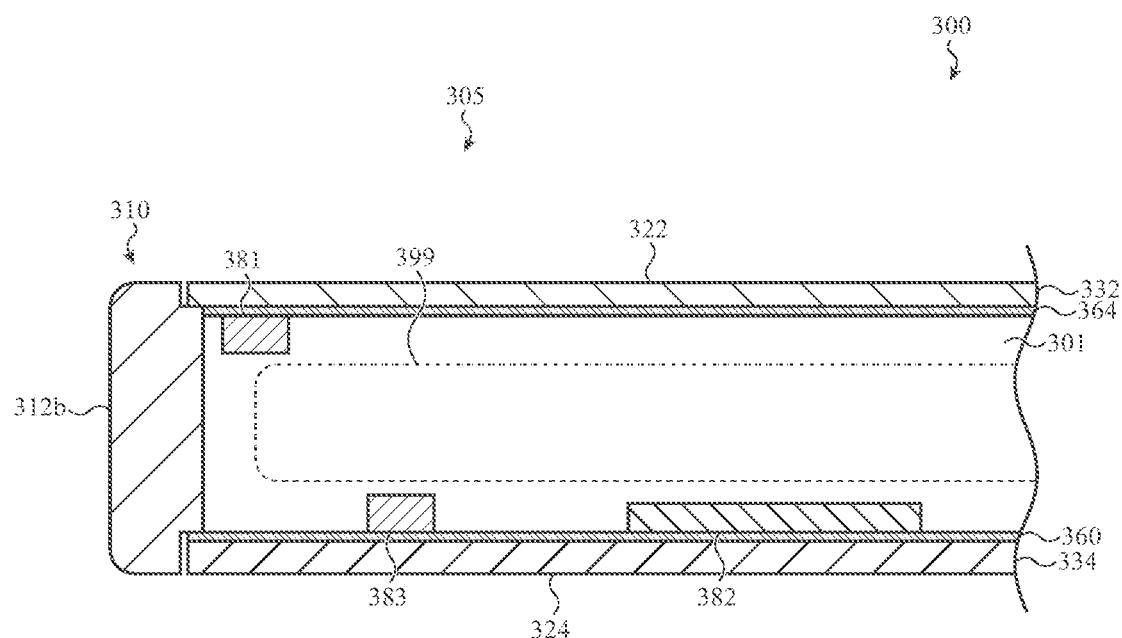
FIG. 3 shows an example partial cross-sectional view of an electronic device.

The electronic device 200 includes a sensing array 270 located at the rear of the electronic device 200. The sensing array 270, which may also be described as a rear-facing sensing array, includes rear-facing optical modules 277 and 278. In the example of FIG. 2, the rear-facing optical modules 277 and 278 are part of a rear-facing camera array 275, as described in more detail below. At least some elements of the camera array 275 are positioned within the internal cavity 201 of the electronic device. The electronic device 200 may also include a component of a wireless communication and/or charging system, as illustrated in FIGS. 1B and 3.

The rear cover assembly 224 includes a cover member 234. In the example of FIG. 2, the rear cover member 234 does not extend over the optical modules 277 and 278. Instead, the cover member 234 defines through-holes 267 and 268 and the optical modules 277 and 278 extend at least partially into these through-holes. Windows 287 and 288 extend over the optical modules 277 and 278 (and over the through-holes 267 and 268). The windows 287 and 288 may be formed of a transparent glass ceramic, or a transparent ceramic such as sapphire, or glass. The rear cover member 234 may extend over a component of a wireless communication and/or charging system, as illustrated in FIGS. 1B and 3.

In the example of FIG. 2, the cover assembly 224 includes a thicker portion 227 and a thinner portion 225 and the sensing array 270 is generally located in the vicinity of the thicker portion 227. The thicker portion 227 is at least partially defined by a thicker portion 237 of the cover member 234 and the thinner portion 225 is at least partially defined by a thinner portion 235 of the cover member 234. The thicker portion 227 also defines a feature 257 that protrudes with respect to the thinner portion 225. The feature 257 is also referred to generally herein as a protruding region, as a protruding feature, as a plateau region or feature, or as a bump.

The thinner portion 225 of the cover assembly 224 defines an exterior surface 226 (also referred to herein as a base surface). The thicker portion 227 of the cover assembly 224 defines an exterior surface 228 (also referred to herein as a raised surface or top surface). As an example, the exterior surface 228 may substantially define a plateau. Such an exterior surface may also be referred to herein as a (raised) plateau surface. The feature 257 protrudes with respect to the exterior surface portion 226.

In the example of FIG. 2, the through-holes 267 and 268 extend through the thicker portion 227 of the cover assembly 224. The size of through-holes 267 and 268 is exaggerated for convenience of illustration. Openings to the holes are located in the exterior surface 228. The through-holes may be referred to as a set of through-holes and in some cases may define an array of through-holes. Similarly, the openings may be referred to as a set of openings and in some cases may define an array of openings. A module such as a camera module, a sensor module, or an illumination module may be positioned below or within each opening of the set of openings. In addition, at least some of the modules may extend into respective through-holes of the set of through-holes. An end of one or more of the modules may project beyond the exterior surface 228.

The cross-sectional view of FIG. 2 shows two optical modules (277, 278) of the camera array 275. The camera array 275 further includes a support structure 271. The support structure 271 may be configured to hold various elements of the camera array 275 in place. For example, each of the optical modules 277 and 278 may be mounted to the support structure 271. In the example of FIG. 2, the support structure 271 includes a bracket 272 that has a non-planar profile. The shape of the bracket 272 is not limited to the example of FIG. 2 and in other examples may have the form of a flat element. The bracket 272 may be coupled to an interior surface of the cover assembly 224. In the example of FIG. 2, the support structure 271 also includes a frame 273 which nests at least partially within the bracket 272 and supports a circuit assembly 274, which may be mounted on a printed circuit board. However, this example is not limiting and in additional embodiments the frame 273 may be omitted. The support structure 271 and the coupling between the camera array 275 and the interior surface 242 of the cover assembly 224 may be configured to limit bending of the cover member 234 in the vicinity of the protruding feature. In some cases, at least one of the optical modules of the camera array 275 is configured to operate over a visible wavelength range.

As previously described with respect to FIGS. 1A and 1B, an optical module may comprise a camera module, an illumination module, an optical sensor, or the like. Typically, the camera array 275 includes at least one camera module and may include two, three, four, or five camera modules. The camera modules are electrically connected to the circuit assembly 274. As shown in FIG. 2, separate windows 287 and 288 are provided over the through-holes 267 and 268 and the retaining components 286 hold the windows 287 and 288 in place. For example, the retaining component 286 may be a ring, such as a metal ring, which surrounds the end of the optical module. Alternately, an optical module may include a window as part of its optical components, with the window being positioned within its housing. The windows may protect underlying components (e.g., cameras, lenses, other sensors), and may define part of the exterior surface 244 of the cover assembly 224.

In embodiments, the cover member 234 includes a colored glass-based material. In some cases, the cover member 234 is formed from the colored glass-based material. As previously discussed, the optical properties of the rear cover member 234 typically influence the optical properties of the rear cover assembly 224. The description provided with respect to the cover member 434 regarding colored glass-based materials and optical properties of colored glass-based materials is generally applicable herein and is not repeated here.

In embodiments, the optical properties of the thicker portion 237 of the cover member 234 vary from those of the thinner portion 235. For example, an average transmission over the visible range may be greater in the thinner portion 235 than in the thicker portion 237. In addition, a color of the thicker portion 237 may be different from that of the thinner portion 235 as described with respect to FIG. 4. The description provided with respect to the cover member 434 of color variation between different portions of the cover member is generally applicable herein and is not repeated here.

As shown in FIG. 2, an internal coating 260 is disposed along an interior surface of the cover member 234. In some embodiments, an external coating, such as a smudge resistant coating, may be disposed along an exterior surface of the cover member 234 as previously described with respect to FIG. 1B. The optical properties of the coating 260 may influence the optical properties of the rear cover assembly. For example, the coating may affect the amount of light transmitted back through the cover member to a viewer and thus may be termed an optical coating. In some embodiments, the coating 260 is configured to at least partially reflect visible light transmitted through the rear cover member and incident on the coating. In other words, the coating 260 is at least partially reflective. Reflection of visible light from the coating sends the reflected light back through the cover member. The reflected light exiting the cover member (and the cover assembly) produces the perceived color of the cover assembly.

The coating need not be mirror-like in order for its optical properties to influence the optical properties of the cover assembly. As one example, a partially reflective coating may simply be white or light in color. In addition, the coating 260 may adsorb at least some wavelengths of light transmitted through the rear cover member 234 and incident on the coating and thus may influence the spectrum or light reflected back through the rear cover member 234. In some cases, the spectrum of light reflected from the coating is similar to that incident on the coating (e.g., for a neutral coating having a* and b* near zero). In additional cases, the coating selectively absorbs some of the incident light, so that the color of the rear cover assembly 224 may differ from that of the rear cover member 234 (without the coating). For example, the perceived color of the rear cover assembly 224 may differ in chroma and/or hue from the color of the rear cover member 234.

The coating 260 may include a color layer, a multilayer interference stack, or both. When the coating includes both a color layer and a multilayer interference stack, the perceived color of the rear cover assembly 224 may be different in regions where the multilayer interference stack is present than in regions free of the multilayer interference stack. A color layer may be polymer based and include a colorant (e.g., a pigment or dye). As used herein, a color layer may have a distinct hue or may be near neutral in color (with a* and b* near zero, e.g., white). The coating 260 may include multiple polymer-based layers, at least one of which is a color layer. The coating 260 may include an optically dense layer, which may be placed behind a color layer or a multilayer interference stack. In some cases, the coating as a whole may be optically dense.

When the coating 260 includes a multilayer interference stack, the multilayer interference stack may be used to define a decorative logo or other symbol. The multilayer interference stack may include multiple dielectric layers, the multiple layers configured to produce optical interference. The multilayer interference stack may also be referred to herein as an optical interference stack or an optical interference coating (or coating element). For example, the multilayer interference stack may include a first layer comprising a first inorganic dielectric material and a second layer comprising a second inorganic dielectric material. For example, the coating may comprise a metal oxide, a metal nitride, and/or a metal oxynitride. Suitable metal oxides include, but are not limited to, a silicon oxide (e.g., $SiO_2$), niobium oxide (e.g., $Nb_2O_5$), titanium oxide (e.g., $TiO_2$), tantalum oxide (e.g., $Ta_2O_5$), zirconium oxide (e.g., $ZrO_2$), magnesium oxide (e.g., MgO), and the like. Suitable metal nitrides include, but are not limited to, silicon nitride ($SiN_x$), silicon oxynitride (e.g., $SiO_xN_y$) and the like. The layers of the first and second inorganic dielectric materials may be thin and may be deposited using physical vapor deposition or a similar technique. The description of the coating 260 is generally applicable herein and not limited solely to the example of FIG. 2.

The cover member 234 may be positioned over one or more internal components of the electronic device 200 and may also be configured to allow transmission of electromagnetic signals to and/or from the internal component. As an example, a colored glass-based material of the cover member 234 may be configured to be RF-transmissive and may have a dielectric constant suitable for use over a radio-frequency antenna or wireless charging system. In some cases, the material or combination of materials of the cover member 234 may have a dielectric constant (also referred to as the relative permittivity) having a value from 3 to 7, 4 to 8, 4 to 6.5, 5 to 7, 5 to 6.5, or 6 to 7 in a radio frequency band. In some cases, these values are maximum values while in other cases these values are measured at the frequency range(s) of interest. As an example, the frequency range of interest may be from about 5 GHz to about 40 GH, or from 25 GHz to 39 GHz. These values may be measured at room temperature. As a further example, the colored glass-based material of the cover member 234 may have a magnetic permeability sufficiently low that it does not interfere with transmission of magnetic fields generated by the inductive coupling wireless charging system. In some cases, the cover member 234 may be substantially non-magnetic.

FIG. 3 shows example partial cross-sectional view of an electronic device. As shown in FIG. 3, the electronic device 300 includes internal device components 381, 382, and 383 positioned within an internal cavity 301. As an example, the device components 381 and 383 may be part of a wireless communication system and the device component 382 may be part of a wireless charging system. In some cases, the electronic device 300 may include an additional device component that is part of the wireless communication system (not shown in this cross-section), which may be similar to the component 185 of FIG. 1A. Additional device components 399 are indicated schematically with a dashed line and may include one or more of the components described with respect to FIG. 8. FIG. 3 may be an example of a partial cross-sectional view along B-B of FIG. 1B.

The enclosure 305 of the electronic device 300 includes a cover assembly 322 comprising a cover member 332. The cover member 332 extends over the internal device component 381 and may be a front cover member. The electronic device also includes a display 364, which may include a touch sensing layer. The enclosure 305 also includes a cover assembly 324 comprising a cover member 334. The cover member 334 extends over the internal device components 382 and 383 and may be a rear cover member. An internal coating 360 is coupled to an interior surface of the cover member 334. The cover assembly 322 and the cover assembly 324 are coupled to a member 312b of an enclosure component 310. The coating 360 may be similar in composition and optical properties to the coating 260 and for brevity that description is not repeated here.

The device component 383 may be part of a wireless communication system and in some cases may be a directional antenna (assembly). By the way of example, the device component 383 may have a primary transmission direction which is substantially perpendicular to the rear surface of the electronic device. The cover member 334 may therefore be configured to provide electrical properties suitable for use over the component of a wireless communication system. For example, the cover member 334 may be a dielectric cover member and may be formed from a material having a dielectric constant and a dissipation factor sufficiently low to allow transmission of RF or IR (e.g., near-IR) signals through the cover member. The cover member 334 may have similar dielectric properties to the cover member 234 and the cover member 434 and for brevity that description not repeated here. The device component 381, as well as the device component 383 may be similar to the device components 181, 183, and 185 and may be operated at similar frequency ranges. For example, the device components 381 and 383 may be compatible with a 5G wireless protocol (including millimeter wave and/or 6 GHz communication signals). In some cases, the device components 381 and 383 may be configured to transmit wireless signals at a frequency band between about 25 GHz and 39 GHz.

When the device component 382 is part of an inductive coupling wireless charging system, the cover member 334 may also be configured to have a magnetic permeability sufficiently low that it does not interfere with transmission of magnetic fields generated by the inductive coupling wireless charging system. For example, the component of an inductive coupling wireless charging system may include a wireless receiver component such as a wireless receiver coil or other feature of the wireless charging system.

The device component 381 may also be part of a wireless communication system and in some cases may be a directional antenna (assembly). By the way of example, the device component 381 may have a primary transmission direction which is substantially perpendicular to the front surface of the electronic device. The cover member 332 may therefore be configured to provide electrical properties suitable for use over the component of a wireless communication system and may have electrical properties similar to those described with respect to the cover member 334 and may have a composition similar to that previously described with respect to the cover member 132 of FIG. 1A.

FIG. 4 shows a partial cross-sectional view of an example cover member assembly 424 of an electronic device. The cover member assembly 424 includes a cover member 434 and a coating 460 along a rear surface of the cover member 434. The coating 460 may be similar in composition and optical properties to the coating 260 and for brevity that description is not repeated here.

In the example of FIG. 4, a portion 436 of the cover member 434 is thicker than a portion 438. In some cases, a thicker portion of an enclosure component will have a different optical, electrical, and/or magnetic property as compared to a thinner portion of the enclosure component as described in more detail below. As shown in FIG. 4, the portion 436 has a thickness $T_2$ and the portion 438 has a thickness $T_1$. The cover member 434 may be an example of the cover member 134, cover member 234, or any other cover member described herein. The example of FIG. 4 is not limiting and additional examples of cover members having two portions of different thickness are shown in FIGS. 6 and 7.

In some embodiments, the thinner portion 438 of the cover member 434 is positioned over a component of a wireless communication system. Therefore, the thinner portion 438 of the cover member 434 may be configured to allow transmission of electromagnetic signals to and/or from a component of the wireless communication system. Alternately or additionally, the thinner portion 438 of the cover member 434 may be positioned over a wireless charging system. In this case the thinner portion 438 of the cover member 434 may be configured to have a magnetic permeability sufficiently low that it does not interfere with transmission of magnetic fields generated by the inductive coupling wireless charging system.

The combined thickness of the portion 436 of the cover member 434 may be greater than that of the portion 438 and may be at least 10%, 25%, or 50% and up to about 100%, about 200%, or about 250% thicker than the thickness of the portion 438. As an example, the percentage difference between the thickness of the portion 436 and the thickness of the portion 438 ranges from 50% to 200%, with the percentage difference calculated as the thickness difference between the thicker portion and the thinner portion divided by the thickness of the thinner portion. In some cases, the thickness of the thicker portion 436 of the cover member is greater than about 1 mm and less than or equal to about 2 mm or about 2.5 mm. The thickness of the thinner portion 438 may be greater than about 0.3 mm and less than about 0.75 mm or greater than about 0.5 mm and less than about 1 mm. The amount of protrusion or offset between the surface region 456 and the surface region 458 may be from about 0.5 mm to about 1.5 mm or from about 0.75 mm to about 2 mm. The size of the feature 437 may depend at least in part on the size of a camera assembly or other device component underlying the thicker portion 436. In some embodiments, a lateral dimension (e.g., a width) of the thicker portion 436 may be from about 5 mm to about 30 mm, from about 10 mm to about 20 mm, or from about 15 mm to 30 mm.

The portion 438 of the cover member 434, which extends from the exterior surface 454 to the interior surface 452, defines a region 458 of the exterior surface 454. The region 458 may also be referred to herein as the surface region 458, as the exterior surface region 458, or as a first or a base surface region. The portion 436 of the cover member 434, which also extends from the exterior surface 454 to the interior surface 452, defines the region 456 of the exterior surface 454. The region 456 may also be referred to herein as the surface region 456, as the exterior surface region 456, or as a second or a raised surface region. The surface region 459 joins the surface region 456 and the surface region 458.

The thicker portion 436 may be described as defining a feature 437 which protrudes with respect to the surface region 458. The feature 437 defines the surface region 456. In the example of FIG. 4, the surface region 456 defines a substantially plateau-shaped top of the feature 437 and through-holes 467 and 468 extend through the thicker portion 436 and the protruding feature 437. Optical modules of the electronic device extend at least partially into these through-holes, as previously described with respect to FIG. 2.

In some cases, at least some portions of the cover member 434 may have a smooth texture such as a polished texture. For example, a polished texture may have a root mean square height from about 1 nm to about 125 nm, from about 1 nm to about 100 nm, from about 1 nm to about 75 nm, from about 1 nm to about 50 nm, from about 1 nm to about 25 nm, or from about 1 nm to about 10 nm. In additional cases, at least some portions of the cover member 434 may have a texture that is rougher than that of a polished texture. For example, this texture may be configured to modify the optical properties, the tactile properties, and/or the cleanability of the textured surface. As a particular example, differences in texture can be configured to provide optical contrast between different portions of the cover member 434, such as a polished surface of the thicker portion 436 and a rougher surface of the thinner portion 438. As examples, the root mean square height of a surface configured to have a texture rougher than a polished surface may be from about 0.1 microns to about 2 microns, from about 0.1 microns to about 1.5 microns, from about 0.1 microns to about 1.25 microns, from about 0.1 microns to about 1.0 micron, from about 0.25 microns to about 2 microns, from about 0.25 microns to about 1.5 microns, from about 0.25 microns to about 1.25 microns, from about 0.25 microns to about 1.0 micron.

The cover member 434 may be characterized by its transmission over a specified range, such as the visible light spectrum (about 380 nm to 700 nm) or a range such as about 380 nm to 800 nm. In some cases, the average transmission for visible light of at least a portion of the cover member is at least 75%, at least 80%, 75% to 95%, 80% to 90%, or 80% to 95%. In additional cases, the transmission over an IR light range of at least a portion of the cover member is at least 70%, at least 75%, at least 80%, from 70% to 95%, or from 80% to 95%. The IR light range may be a near-IR range, such as from 770 nm to 1000 nm, or one or more subranges within this range such as from 900 nm to 1000 nm or 920 nm to 960 nm. The cover member 434 may also be characterized by its color. When an enclosure component is formed from a colored glass-based material, the enclosure component may appear to have a color when viewed normal to the front-facing surface. The enclosure component may also appear to have a color when viewed at another angle or from the side.

The color of the cover member 434 may be characterized in several ways. For example, the color of a component may be characterized by coordinates in CIEL*a*b* (CIELAB) color space. In CIEL*a*b* (CIELAB) color space, L* represents brightness, a* the position between red/magenta and green, and b* the position between yellow and blue. Alternately or additionally, the color of the rear cover assembly may be characterized by coordinates in L*C*h* color space, where C* represents the chroma and $h_{ab}$ represents the hue angle (in degrees). The chroma C* is related to a* and b* as $C=\sqrt{(a^*)^2+(b^*)^2}$. In addition, the hue angle $h_{ab}$ is related to a* and b* as $$h_{ab} = \tan^{-1}\frac{b*}{a*}.$$

A broadband or semi-broadband illuminant may be used to determine the color of a portion of the cover member or cover assembly. For example, a CIE illuminant or other reference illuminant may be used. In some cases, the color of the cover member 434 may be determined from light transmitted through the cover member. In additional cases, the color of the cover member 434 may be determined from light reflected back through the cover member (e.g., using a white background). The CIELAB or L*C*h coordinates for a given illuminant can be measured with a device such as a colorimeter or a spectrophotometer or calculated from transmission or reflectance spectra.

In some examples, a color of an enclosure component such as the cover member 434 is characterized by an a* value having a magnitude greater than or equal to 0.25, greater than or equal to 0.5, greater than or equal to 0.75, or greater than or equal to 1. In additional examples, the color of the enclosure component is characterized by a b* value having a magnitude greater than or equal to 1, greater than or equal to 1.5, or greater than or equal to 2. In further examples, the color of the enclosure component such as the cover member 434 may have an L* value of at least 80, at least 85, or at least 90. In addition, the color of the enclosure component may be characterized by having a C* value greater than 1.75, greater than 2, or greater than 2.5.

As previously discussed, in some embodiments, different portions of an enclosure component may have different colors. For an enclosure component which has a thicker portion and a thinner portion, an example of which is shown in FIG. 4, the thicker portion may have a different color than the thinner portion due at least in part to the greater thickness of glass-based material interacting with the light in the thicker portion. For example, a perpendicular light ray that enters the cover member 434 and reflects from the coating 460 would have a greater path length in the thicker portion 436 than in the thinner portion 438 (e.g., twice $T_2$ vs. twice $T_1$ for a ray reflecting from the top surface of the coating).

The difference in color can be characterized by the differences in one or more individual parameters such as ΔL*, Δa*, Δb*, or C*. In embodiments, the L* value of the thicker portion may be less than the L* of the thinner portion. As examples, a difference in the L* values between the thicker and the thinner portions is at least 5, at least 10, at least 15, at least 20, or from 10 to 40. In additional embodiments, the C* value of the thicker portion may be greater than the C* of the thinner portion. As examples, the C* value of the thicker portion may be at least 20, 25, 30, 35, or 40. A chroma difference (ΔC*) between the two portions may be at least 10, at least 15, at least 20, at least 25, or ranging from 15 to 50.

The difference in color at two locations on a component, such as the cover member 434, may also be characterized in additional ways. For example, the color difference in the L*a*b* color space may be characterized by the single value $\Delta E^*_{ab}$ as specified in Equation 1.

$$\Delta E^*_{ab}=\sqrt{(\Delta L^*)^2+(\Delta a^*)^2+(\Delta b^*)^2} \qquad \text{Equation 1}$$

In addition, the color difference in the L*C*h* color space may be characterized by the hue difference $\Delta H^*_{ab}$ as specified in Equation 2.

$$\Delta H^*_{ab}=\sqrt{(\Delta E^*)^2-(\Delta L^*)^2-(\Delta C^*)^2} \qquad \text{Equation 2}$$

In some embodiments, a hue difference (ΔH*) between the two locations (and the two colors) is less than 15 degrees or less 10 degrees. A relatively small difference in hue, such as difference of 15 degrees or less in hue, between different portions of the cover member (and cover assembly) can produce a harmonious effect.

In some cases, the colored glass-based material derives its color from elements which are incorporated into a glass phase and/or a crystalline phase of the material. The coloring element(s) may be configured to produce a desired color when visible light is transmitted through the material (e.g., the coloring element(s) may be in a suitable oxidation state and present in a suitable amount). Suitable elements for coloring (also referred to as tinting) of the glass-based material include, but are not limited to, rare earth elements and transition metal elements. Transition metal elements include, but are not limited to, titanium, chromium, vanadium, manganese, iron, cobalt, nickel, copper, silver, gold, and the like. The rare earth or transition metal element may be incorporated into a glass phase as a glass network modifier, a glass network former, or a combination thereof. The rare earth or transition metal element may be incorporated into a crystalline phase of a glass ceramic.

Alternatively or additionally, the colored glass-based material derives its color from one or more elements which form a distinct nanophase within a glass and/or a crystalline phase of the material. The coloring element(s) may be configured to produce a desired color when visible light is transmitted through the material (e.g., the nanophase may be of a suitable composition and size and present in a suitable amount). For example, when the nanophase is in the form of a nanoparticle, one or more of the size, shape, and concentration of the nanoparticles can influence the color of a cover member or other part formed from the colored glass-based material. Suitable elements for forming distinct nanophases within the glass-based material include, but are not limited to, transition metals such as titanium, chromium, vanadium, manganese, iron, cobalt, nickel, copper, silver, gold, and the like or rare earth elements such as lanthanides (e.g., cerium, praseodymium, neodymium), which may be present in a rare earth oxide. When the element is a metal, the nanophase may take the form of metallic nanoparticles. In some additional cases, one or more of these elements may be combined with oxygen, nitrogen, or both to form a compound such as a metal oxide or a metal nitride. As referred to herein, a nanophase or nanoparticle may have a size less than 1 micrometer, such as from 10 nm to less than 1 micrometer, from 15 nm to 200 nm, from 15 nm to 100 nm, from 50 nm to 150 nm, or from 100 nm to 200 nm.

In some embodiments, the glass-based material includes multiple nanophases. For example, the glass-based material may include two or more nanophases which differ in composition, such as a first set of nanoparticles formed from a first metal and a second set of nanoparticles formed from a second metal different from the first metal. As additional examples, the glass-based material may include first and second nanophases which generally have the same composition, but which differ in one or more of size, shape, or concentration. As a specific example, two different sets of nanoparticles formed from the same metal but having different shapes may produce different colors in an article formed from the glass-based material. The two different sets of nanoparticles may be located in different regions of the article formed from the glass-based material, in overlapping regions of the article, or in the same region of the article. In some cases, the first set of nanoparticles may have a generally spherical shape and the second set of nanoparticles may have a different shape, such as an elongated shape.

In embodiments, the distribution of the nanoparticles within the glass-based material is substantially uniform. For example, the concentration of the nanoparticles may be similar through the thickness of an article formed from the glass-based material. Such a concentration profile may be obtained at least in part by using a heat treatment process that heats the entire article formed from the glass-based material for a sufficient time to allow substantially uniform formation of the nanoparticles.

The composition of the colored glass-based material may affect not only the color of an enclosure component but may also affect another optical property and/or an electrical or magnetic property and/or a mechanical property. In some cases, the properties of the glass-based material including one or more "coloring" elements may be compared to those of a "base" glass-based material that is similar in composition but does not include the coloring element(s). As an example, inclusion of the coloring element(s) (e.g., transition metal elements included in the glass phase and/or forming metal nanoparticles within the glass phase) may modify the dielectric constant of the glass-based material as compared to a "base" glass-based material. In some cases, the dielectric constant of the colored glass-based material is higher than that of the "base" glass-based material, so that adding more of the coloring element(s) to the base composition can unduly increase the dielectric constant. Glass-based material compositions useful for the enclosure components described herein may provide a balance between desired color (e.g., chroma) and/or other optical properties and desired electrical and/or magnetic properties. In some cases, the dielectric constant has a value from 3 to 7, 4 to 8, 4 to 6.5, 5 to 7, 5 to 6.5, or 6 to 7 in a radio frequency band (e.g., from about 5 GHz to about 40 GHz or 25 GHz to 39 GHz). In these cases, the C* chroma value may have a value greater than 1.75, greater than 2, or greater than 2.5.

In embodiments, the nanophase can improve the toughness of the colored glass-based material as compared to a "base" glass-based material. In some cases, enhanced toughness may be obtained with increased particle size and/or reduced spacing between the particles. However, when the nanophase includes metallic particles, increasing the concentration of the nanoparticles may also increase the dielectric constant. Therefore, the glass-based material compositions useful for the enclosure components described herein may provide a balance between desired color (e.g., chroma) and/or other optical properties, desired electrical and/or magnetic properties, and desired mechanical properties.

The colored glass material may be silicate glass, such as an aluminosilicate glass or a boroaluminosilicate glass. As used herein, an aluminosilicate glass includes the elements aluminum, silicon, and oxygen, but may further include other elements. Similarly, a boroaluminosilicate glass includes the elements boron, aluminum, silicon, and oxygen, but may further include other elements. For example, an aluminosilicate glass or a boroaluminosilicate glass may further include phosphorus and/or an alkaline earth metal. As an additional example, an aluminosilicate glass or a boroaluminosilicate glass may further include monovalent or divalent ions which compensate charges due to replacement of silicon ions by aluminum ions. Suitable monovalent ions include, but are not limited to, alkali metal ions such as $Li^+$, $Na^+$, or $K^+$, such as in alkali aluminosilicate glass. Suitable divalent ions include alkaline earth ions such as $Ca^{2+}$ or $Mg^{2+}$, such as in an alkaline earth aluminosilicate glass. In embodiments, the colored glass material is ion exchangeable.

In additional embodiments, the colored glass-based material may be a colored glass ceramic material or a combination of a colored glass material and a colored glass ceramic material. As referred to herein, a glass ceramic material comprises one or more crystalline phases (e.g., crystals) formed by crystallization of a (precursor) glass material. These crystalline phases can contribute to the favorable mechanical properties of the glass ceramic material. The glass ceramic may further comprise an amorphous (glass) phase and the crystals may be dispersed in the glass phase. In some examples, the amount of the crystalline phase(s) is greater than 10%, from 20% to 90%, from 30% to 90%, from 40% to 90%, from 50% to 90%, from 60% to 90%, from 70% to 90%, from 20% to 40%, from 20% to 60%, from 20% to 80%, from 30% to 60%, or from 30% to 80% of the glass ceramic by weight. In some cases, these values may correspond to an average amount or a local amount of crystalline phase(s) in the glass ceramic component. The residual glass phase may form the balance of the material.

By the way of example, the glass ceramic material may be an alkaline silicate, an alkaline earth silicate, an aluminosilicate, a boroaluminosilicate, a perovskite-type glass ceramic, a silicophosphate, an iron silicate, a fluorosilicate, a phosphate, or a glass ceramic material from another glass ceramic composition system. In some embodiments, the glass ceramic material comprises an aluminosilicate glass ceramic or a boroaluminosilicate glass ceramic. Aluminosilicate glasses can form several types of crystalline phases, including β quartz solid solution crystals, keatite solid solution crystals (β spodumene solid solution crystals), petalite crystals, lithium disilicate crystals, and various other silicates. Other silicates include, but are not limited to, silicates including aluminum and optionally other elements such as lithium, sodium, potassium, and the like. Examples of such silicates include lithium orthoclase, lithium orthosilicate, (Li, Al, Na) orthosilicates (e.g., a or B cucryptite), and lithium metasilicate.

In addition to the principal elements of the glass ceramic material (e.g., aluminum, silicon, and oxygen for an aluminosilicate) the glass ceramic material may also include other elements. For example, the glass ceramic material (and the precursor glass) may include elements from nucleating agents for the glass ceramic material, such as a metal oxide (Ti, Zr) or other suitable oxide material. Aluminosilicate and boroaluminosilicate glass ceramics may further include elements (e.g., monovalent or divalent ions) similar to those described for aluminosilicate and boroaluminosilicate glasses. Suitable monovalent ions include, but are not limited to, alkali metal ions such as $Li^+$, $Na^+$, or $K^+$. Suitable divalent ions include alkaline earth ions such as $Ca^{2+}$ or $Mg^{2+}$. The colored glass ceramic material may be ion exchangeable. As previously described, the colored glass ceramic material typically also includes one or more elements used to impart color.

In some cases, the colored glass-based material is chemically strengthened by ion exchange. For example, an ion-exchangeable glass or glass ceramic material may include monovalent or divalent ions such as alkali metal ions (e.g., $Li^+$, $Na^+$, or $K^+$) or alkaline earth ions (e.g., $Ca^{2+}$ or $Mg^{2+}$) that may be exchanged for other alkali metal or alkaline earth ions. If the glass or glass ceramic material comprises sodium ions, the sodium ions may be exchanged for potassium ions. Similarly, if the glass or glass ceramic material comprises lithium ions, the lithium ions may be exchanged for sodium ions and/or potassium ions. Exchange of smaller ions in the glass or glass ceramic material for larger ions can form a compressive stress layer along a surface of the glass or glass ceramic material. Formation of such a compressive stress layer can increase the hardness and impact resistance of the glass or glass ceramic material. In some cases, a chemically strengthened component formed from a colored glass-based material is configured to have a composition stable under typical use conditions of the electronic device and under processing conditions experienced subsequent to chemical strengthening (e.g., during a subsequent coating operation). By the way of example, the chemically strengthened component may include a compressive stress layer having a surface compression stress from 400 MPa to 700 MPa or 500 MPa to 700 MPa and an overall depth of compression from 75 microns to 150 microns or from 100 microns to 175 microns. In some cases, an ion-exchanged region of the component is enriched in potassium near the surface and enriched in sodium at greater depths and the resulting compressive stress layer comprises a region of higher compressive stress near the surface that may be relatively shallow (e.g., a depth from about 3 microns to about 20 microns).

In some cases, an enclosure component or other component of the electronic device is formed from one of a set of compositions of the colored glass-based material. Each composition of the set of compositions may produce a different color of enclosure component. The set of compositions may be selected so that the enclosure component has another optical property (e.g., IR transmission), an electrical property (e.g., dielectric constant), or both within a specified range. The uniformity of the optical and/or electrical property allows differently colored enclosure components to have similar performance when placed over an internal component, such as a component of a wireless communication or charging system or an IR sensor.

Figure 5:
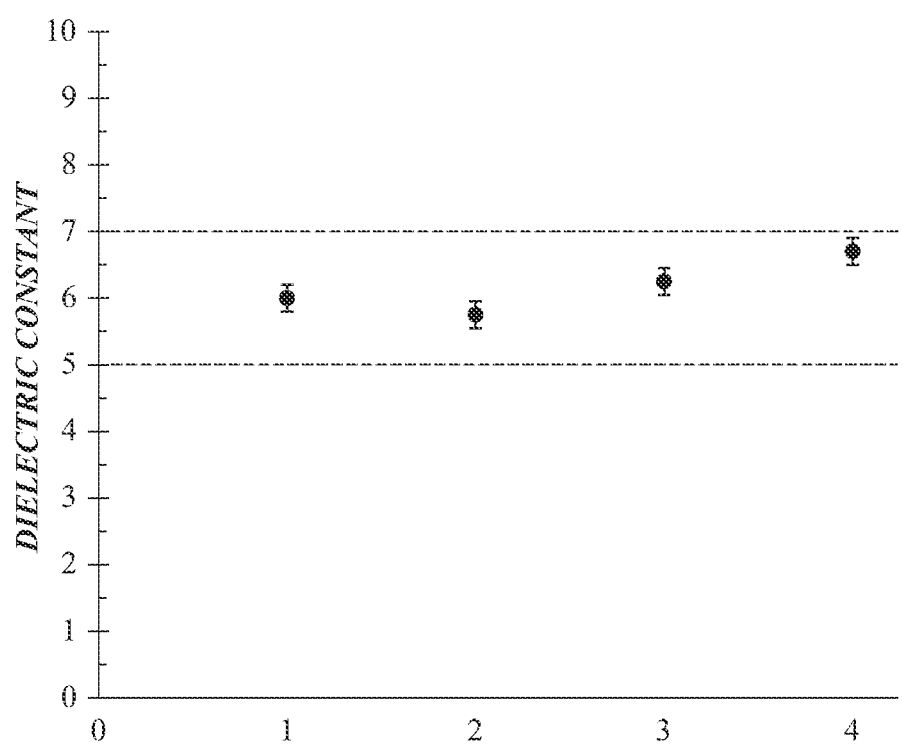
FIG. 5 schematically shows dielectric constant values for a set of colored glass compositions suitable for use in enclosure components.

FIG. 5 schematically shows dielectric constant values for a set of colored glass compositions suitable for use in enclosure components as described herein. Each glass composition of the set of glass compositions produces an enclosure component having a different color and a dielectric constant falling within the range indicated by the dashed horizontal lines. The uniformity of the dielectric constant allows differently colored enclosure components to have similar performance when placed over an internal component such as a component of a wireless communication system (e.g., a radio-frequency (RF) antenna assembly). The description of wireless communication system components provided with respect to FIGS. 1A, 1B, and 3 is generally applicable here and is not repeated here.

In the example of FIG. 5, each glass composition (1 through 4) of the set of glass compositions has been adjusted to produce a different color and a dielectric constant in a range from 5 to 7. As previously discussed, these dielectric constant values may be applicable for a frequency range from about 5 GHz to about 40 GHz. In some cases, there can be some variation in the dielectric constant value over the frequency range. In the example of FIG. 5, the solid data point indicates a median dielectric constant in the middle of the frequency range and the bars extending from the data point indicate the maximum and minimum dielectric constant values within the frequency range. The range shown in FIG. 5 is exemplary rather than limiting and in additional examples the dielectric constant may range from 3 to 7, 4 to 8, 4 to 6.5, 5 to 6.5, or 6 to 7 as discussed in more detail with respect to FIGS. 2 and 4.

FIG. 6 shows a cross-sectional view of another example cover member assembly of an electronic device which varies in thickness. The cover member assembly 604 includes a cover member 620 and a coating 660 along a rear surface of the cover member 634. The coating 660 may be similar in composition and optical properties to the coating 260 and for brevity that description is not repeated here.

In the example of FIG. 6, at least part of the peripheral portions 694 of the cover member 620 are thinner than the central portion 692. As shown in FIG. 6, the peripheral portions 694 have a minimum thickness $T_3$ and the central portion 692 has a thickness $T_4$. When the cover member 620 is formed from a colored glass-based material, the peripheral portions 694 may have one or more optical properties, such as a color, which differ from those of the central portion 692. In some cases, the curvature of the front surface in the peripheral portions 694 may also influence the color in these regions.

In the example of FIG. 6, the central portion 692 and the peripheral portion 694 are contiguous. The central portion 692 includes a central exterior surface 622a and a central interior surface 624a. In the example of FIG. 6, the central exterior surface 622a and the central interior surface 624a are generally planar in the central portion of the cover. The peripheral portion 694 includes a peripheral exterior surface 622b, a side surface 626, and an interior peripheral surface 624b. The peripheral exterior surface 622b includes a curve which generally curves towards the interior of the electronic device. In other words, the curve defined by the peripheral exterior surface 622b is convex.

FIG. 7 shows a cross-sectional view of another example cover member assembly of an electronic device which varies in thickness. The cover member assembly 704 includes a cover member 700 and a coating 760 along the rear surface of the cover member 700. The coating 760 may be similar in composition and optical properties to the coating 260 and for brevity that description is not repeated here.

In the example of FIG. 7 at least part of the peripheral portions 725 of the cover member 700 are thicker than the central portion 720. When the cover member 700 is formed from a colored glass-based material, the peripheral portions 725 may have one or more optical properties, such as a color, which differ from those of the central portion 720. In some cases, the curvature of the front surface in the peripheral portions 725 may also influence the color in these regions.

The exterior surface of peripheral portion 725 comprises a first peripheral exterior surface 702b, which is generally flat, and a second peripheral exterior surface 702c, which is curved. As shown, the thickness of peripheral portion 725 varies, but at least some sections of the peripheral portion have a thickness greater than the thickness $T_5$ of the central portion 720.

One measure of the thickness in the peripheral portion is the distance from the peripheral interior surface 704c to the first peripheral exterior surface 702b along a perpendicular to peripheral interior surface 704c, labeled as $T_6$ in FIG. 7. A measure of the lateral thickness in the peripheral portion is a distance between transitional interior surface 704b to side surface 708 along a perpendicular to transitional interior surface 704b, labeled as $X_6$ in FIG. 7. Each of $X_6$ and $T_6$ may be greater than thickness $T_5$, as shown in FIG. 7. When the glass article has a generally planar exterior region as shown in FIG. 7, an axis aligned with the generally planar exterior region may be referred to as a horizontal axis. In this case, $X_6$ may be referred to as a thickness in a horizontal direction and $T_6$ may be referred to as a thickness in a vertical direction. FIG. 7 also shows a distance $X_5$ between the transitional interior surfaces 704b.

The curve defined by the second peripheral exterior surface 702c may span a substantial fraction of a thickness of the peripheral region. As examples, the horizontal distance spanned by the curve may be at least 30%, 40%, or 50% of distance $X_6$. In addition, the vertical distance spanned by the curve may be at least 20%, 30%, or 40% of distance $T_6$. As shown in FIG. 7, the second peripheral exterior surface 702c may adjoin side surface 708. Alternately, the second peripheral exterior surface 702c may adjoin peripheral interior surface 704c.

As shown, the peripheral portion 725 steps down (e.g., transitions in thickness) to the central portion 720, with the transition in thickness being along the interior surface of the glass article. The interior surface of the article includes central interior surface 704a in the central portion, peripheral interior surface 704c in the peripheral portion, and transitional interior surface 704b at a transition in thickness between the central portion and the peripheral portion. Central exterior surface 702a is generally opposite central interior surface 704a.

FIG. 8 shows a block diagram of a sample electronic device incorporating a component including a colored glass-based material. The schematic representation depicted in FIG. 8 may correspond to components of the devices depicted in FIGS. 1A to 7 as described above. However, FIG. 8 may also more generally represent other types of electronic devices including a component comprising a colored glass-based material as described herein.

In embodiments, an electronic device 800 may include sensors 820 to provide information regarding configuration and/or orientation of the electronic device in order to control the output of the display. For example, a portion of the display 808 may be turned off, disabled, or put in a low energy state when all or part of the viewable area of the display 808 is blocked or substantially obscured. As another example, the display 808 may be adapted to rotate the display of graphical output based on changes in orientation of the device 800 (e.g., 90 degrees or 180 degrees) in response to the device 800 being rotated.

The electronic device 800 also includes a processor 806 operably connected with a computer-readable memory 802. The processor 806 may be operatively connected to the memory 802 component via an electronic bus or bridge. The processor 806 may be implemented as one or more computer processors or microcontrollers configured to perform operations in response to computer-readable instructions. The processor 806 may include a central processing unit (CPU) of the device 800. Additionally, and/or alternatively, the processor 806 may include other electronic circuitry within the device 800 including application specific integrated chips (ASIC) and other microcontroller devices. The processor 806 may be configured to perform functionality described in the examples above.

The memory 802 may include a variety of types of non-transitory computer-readable storage media, including, for example, read access memory (RAM), read-only memory (ROM), erasable programmable memory (e.g., EPROM and EEPROM), or flash memory. The memory 802 is configured to store computer-readable instructions, sensor values, and other persistent software elements.

The electronic device 800 may include control circuitry 810. The control circuitry 810 may be implemented in a single control unit and not necessarily as distinct electrical circuit elements. As used herein, "control unit" will be used synonymously with "control circuitry." The control circuitry 810 may receive signals from the processor 806 or from other elements of the electronic device 800.

As shown in FIG. 8, the electronic device 800 includes a battery 814 that is configured to provide electrical power to the components of the electronic device 800. The battery 814 may include one or more power storage cells that are linked together to provide an internal supply of electrical power. The battery 814 may be operatively coupled to power management circuitry that is configured to provide appropriate voltage and power levels for individual components or groups of components within the electronic device 800. The battery 814, via power management circuitry, may be configured to receive power from an external source, such as an alternating current power outlet. The battery 814 may store received power so that the electronic device 800 may operate without connection to an external power source for an extended period of time, which may range from several hours to several days.

In some embodiments, the electronic device 800 includes one or more input devices 818. The input device 818 is a device that is configured to receive input from a user or the environment. The input device 818 may include, for example, a push button, a touch-activated button, a capacitive touch sensor, a touch screen (e.g., a touch-sensitive display or a force-sensitive display), a capacitive touch button, dial, crown, or the like. In some embodiments, the input device 818 may provide a dedicated or primary function, including, for example, a power button, volume buttons, home buttons, scroll wheels, and camera buttons.

The device 800 may also include one or more sensors or sensor modules 820, such as a force sensor, a capacitive sensor, an accelerometer, a barometer, a gyroscope, a proximity sensor, a light sensor, or the like. In some cases, the device 800 includes a sensor array (also referred to as a sensing array) which includes multiple sensors 820. For example, a sensor array associated with a protruding feature of a cover member may include an ambient light sensor, a Lidar sensor, and a microphone. As previously discussed with respect to FIG. 1B, one or more camera modules may also be associated with the protruding feature. The sensors 820 may be operably coupled to processing circuitry. In some embodiments, the sensors 820 may detect deformation and/or changes in configuration of the electronic device and be operably coupled to processing circuitry that controls the display based on the sensor signals. In some implementations, output from the sensors 820 is used to reconfigure the display output to correspond to an orientation or folded/unfolded configuration or state of the device. Example sensors 820 for this purpose include accelerometers, gyroscopes, magnetometers, and other similar types of position/orientation sensing devices. In addition, the sensors 820 may include a microphone, an acoustic sensor, a light sensor (including ambient light, infrared (IR) light, ultraviolet (UV) light), an optical facial recognition sensor, a depth measuring sensor (e.g., a time of flight sensor), a health monitorsensor (e.g., an electrocardiogram (erg) sensor, a heart rate sensor, a photoplethysmogram (ppg) sensor, a pulse oximeter, a biometric sensor (e.g., a fingerprint sensor), or other types of sensing device.

In some embodiments, the electronic device 800 includes one or more output devices 804 configured to provide output to a user. The output device 804 may include a display 808 that renders visual information generated by the processor 806. The output device 804 may also include one or more speakers to provide audio output. The output device 804 may also include one or more haptic devices that are configured to produce a haptic or tactile output along an exterior surface of the device 800.

The display 808 may include a liquid-crystal display (LCD), a light-emitting diode (LED) display, an LED-backlit LCD display, an organic light-emitting diode (OLED) display, an active layer organic light-emitting diode (AMOLED) display, an organic electroluminescent (EL) display, an electrophoretic ink display, or the like. If the display 808 is a liquid-crystal display or an electrophoretic ink display, the display 808 may also include a backlight component that can be controlled to provide variable levels of display brightness. If the display 808 is an organic light-emitting diode or an organic electroluminescent-type display, the brightness of the display 808 may be controlled by modifying the electrical signals that are provided to display elements. In addition, information regarding configuration and/or orientation of the electronic device may be used to control the output of the display as described with respect to input devices 818. In some cases, the display is integrated with a touch and/or force sensor in order to detect touches and/or forces applied along an exterior surface of the device 800.

The electronic device 800 may also include a communication port 812 that is configured to transmit and/or receive signals or electrical communication from an external or separate device. The communication port 812 may be configured to couple to an external device via a cable, adaptor, or other type of electrical connector. In some embodiments, the communication port 812 may be used to couple the electronic device 800 to a host computer.

The electronic device 800 may also include at least one accessory 816, such as a camera, a flash for the camera, or other such device. The camera may be part of a camera array or sensing array that may be connected to other parts of the electronic device 800 such as the control circuitry 810.

As used herein, the terms "about," "approximately," "substantially," "similar," and the like are used to account for relatively small variations, such as a variation of +/−10%, +/−5%, +/−2%, or +/−1%. In addition, use of the term "about" in reference to the endpoint of a range may signify a variation of +/−10%, +/−5%, +/−2%, or +/−1% of the endpoint value. In addition, disclosure of a range in which at least one endpoint is described as being "about" a specified value includes disclosure of the range in which the endpoint is equal to the specified value.

As used herein, the phrase "one or more of" or "at least one of" or" preceding a series of items, with the term "and" or "or" to separate any of the items, modifies the list as a whole, rather than each member of the list. The phrase "one or more of" or "at least one of" does not require selection of at least one of each item listed; rather, the phrase allows a meaning that includes at a minimum one of any of the items, and/or at a minimum one of any combination of the items, and/or at a minimum one of each of the items. By way of example, the phrases "one or more of A, B, and C" or "one or more of A, B, or C" each refer to only A, only B, or only C; any combination of A, B, and C; and/or one or more of each of A, B, and C. Similarly, it may be appreciated that an order of elements presented for a conjunctive or disjunctive list provided herein should not be construed as limiting the disclosure to only that order provided.

The following discussion applies to the electronic devices described herein to the extent that these devices may be used to obtain personally identifiable information data. It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not intended to be exhaustive or to limit the embodiments to the precise forms disclosed. It will be apparent to one of ordinary skill in the art that many modifications and variations are possible in view of the above teachings.

What is claimed is:

1. An electronic device, comprising:
a display; and
an enclosure comprising:
   an enclosure component;
   a front cover assembly coupled to the enclosure component and comprising a front cover member positioned over the display;
   a rear cover assembly coupled to the enclosure component and including:
      a rear cover member formed from a glass material including metal nanoparticles configured to impart color to the glass material and having a dielectric constant from 5 to 7 in a frequency band from 5 GHz to 40 GHZ, the rear cover member comprising:
         a first portion defining a first thickness and characterized by a first color; and
         a second portion defining a second thickness, greater than the first thickness, and characterized by a second color, different from the first color; and
      a coating disposed along an interior surface of the rear cover member.

2. The electronic device of claim 1, wherein:
the electronic device further comprises a rear-facing camera array comprising an array of camera modules;
the second portion of the rear cover member defines an array of through-holes; and
each camera module of the array of camera modules extends into a respective through-hole of the array of through-holes.

3. The electronic device of claim 1, wherein the second portion includes a periphery of the rear cover member.

4. The electronic device of claim 1, wherein the electronic device further comprises an RF antenna assembly configured to operate in the frequency band.

5. The electronic device of claim 1, wherein:
the first portion has an L* value of at least 90; and
an L* difference between the first portion and the second portion is at least 10.

6. The electronic device of claim 1, wherein a chroma difference between the second portion and the first portion is at least 10.

7. The electronic device of claim 6, wherein:
a percentage difference between the second thickness and the first thickness ranges from 50% to 200%; and
the chroma difference between the second portion and the first portion is from 15 to 50.

8. An electronic device comprising:
an enclosure comprising:
  an enclosure component defining a side surface of the electronic device;
  a front cover assembly coupled to the enclosure component, defining a front surface of the electronic device, and comprising a front cover member; and
  a rear cover assembly coupled to the enclosure component, defining a rear surface of the electronic device, and comprising:
    a rear cover member formed from a colored glass material and having a dielectric constant from 5 to 6.5 in a frequency band from 5 GHz to 40 GHZ, at least a portion of the rear cover member having:
      an average transmission for visible light greater than 75%; and
      a chroma value of at least 1.75; and
    an optical coating disposed along an interior surface of the rear cover member;
a display positioned below the front cover assembly; and
a transceiver component of a wireless communication system positioned below the rear cover assembly.

9. The electronic device of claim 8, wherein:
the portion of the rear cover member is a first portion having a first thickness; and
a second portion of the rear cover member has:
  a second thickness, greater than the first thickness;
  an average transmission for the visible light less than the average transmission for visible light of the first portion; and
  a chroma value greater than the chroma value of the first portion.

10. The electronic device of claim 9, wherein the chroma value of the second portion of the rear cover member is at least 25.

11. The electronic device of claim 8, wherein at least a portion of the optical coating is characterized by an L* value of 90 or more, an a* value having a magnitude less than 0.5, and a b* value having a magnitude less than 1.

12. The electronic device of claim 8, wherein the optical coating further includes a multilayer interference stack comprising multiple dielectric layers configured to produce optical interference.

13. The electronic device of claim 8, wherein the transceiver component is a directional antenna configured to transmit wireless signals and a frequency band of the directional antenna is between 25 GHz and 39 GHz.

14. The electronic device of claim 8, wherein the colored glass material comprises a transition metal element incorporated into a glass phase of the colored glass material.

15. An electronic device comprising:
a display;
a rear-facing camera array comprising an array of camera modules; and
an enclosure comprising:
  an enclosure component defining a side surface of the electronic device;
  a first cover assembly defining a front surface of the electronic device, the first cover assembly comprising a first cover member positioned over the display; and
  a second cover assembly defining a rear surface of the electronic device and comprising:
    a second cover member formed of a colored glass, a first portion of the second cover member having a first L* value and a second portion of the second cover member having a second L* value, less than the first L* value and defining an array of through-holes, each camera module of the array of camera modules extending into a respective through-hole of the array of through-holes; and
    a coating disposed along an interior surface of the second cover member.

16. The electronic device of claim 15, wherein the second portion of the second cover member has a transmission for visible light less than 75%.

17. The electronic device of claim 15, wherein a hue difference (ΔH*) between the first portion and the second portion is less than 15 degrees.

18. The electronic device of claim 17, wherein:
the first portion of the second cover member has a first hue; and
the coating is configured so that a corresponding portion of the second cover assembly has a second hue different from the first hue.

19. The electronic device of claim 15, wherein:
the first portion of the second cover member has a thickness greater than 0.3 mm and less than 0.75 mm; and
the second portion of the second cover member has a thickness greater than 1 mm and less than or equal to 2 mm.

20. The electronic device of claim 15, wherein the colored glass is an ion exchanged alkali aluminosilicate glass.

* * * * *